(12) United States Patent
Bonekamp et al.

(10) Patent No.: US 10,770,609 B2
(45) Date of Patent: *Sep. 8, 2020

(54) MULTILAYERED POLYOLEFIN-BASED FILMS HAVING A LAYER COMPRISING A CRYSTALLINE BLOCK COPOLYMER COMPOSITE OR A BLOCK COPOLYMER COMPOSITE RESIN

(71) Applicant: Dow Gobal Technologies LLC, Midland, MI (US)

(72) Inventors: Jeffrey E. Bonekamp, Midland, MI (US); Yushan Hu, Pearland, TX (US); Nichole E. Nickel, Midland, MI (US); Lih-Long Chu, Midland, MI (US); John A. Naumovitz, Midland, MI (US); Mark G. Hofius, Midland, MI (US)

(73) Assignee: Dow Global Technologies LLC, Midland, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/205,472

(22) Filed: Nov. 30, 2018

(65) Prior Publication Data

US 2019/0123226 A1 Apr. 25, 2019

Related U.S. Application Data

(63) Continuation of application No. 14/119,588, filed as application No. PCT/US2012/044558 on Jun. 28, 2012, now abandoned.
(Continued)

(51) Int. Cl.
*H01L 31/049* (2014.01)
*B32B 27/32* (2006.01)
(Continued)

(52) U.S. Cl.
CPC .......... *H01L 31/049* (2014.12); *B29C 41/003* (2013.01); *B29C 41/26* (2013.01);
(Continued)

(58) Field of Classification Search
CPC .......... B32B 27/08; B32B 27/32; B32B 7/12; B32B 2323/10; B32B 2307/542;
(Continued)

(56) References Cited

U.S. PATENT DOCUMENTS

| 3,236,917 A | 2/1966 | Nata et al. |
| 3,557,265 A | 1/1971 | Chisholm et al. |

(Continued)

FOREIGN PATENT DOCUMENTS

| EP | 2277693 A1 | 1/2011 |
| EP | 2613361 A1 | 7/2013 |

(Continued)

OTHER PUBLICATIONS

PCT/US2012/044558, International Preliminary Report on Patentability.
(Continued)

*Primary Examiner* — Samir Shah
(74) *Attorney, Agent, or Firm* — Quarles & Brady LLP

(57) ABSTRACT

Disclosed are multilayer film structures including a layer (B) that includes a crystalline block copolymer composite (CBC) or a specified block copolymer composite (BC), including i) an ethylene polymer (EP) including at least 80 mol % polymerized ethylene; ii) an alpha-olefin-based crystalline polymer (CAOP) and iii) a block copolymer including (a) an ethylene polymer block including at least 80 mol % polymerized ethylene and (b) a crystalline alpha-olefin block (CAOB); and a layer C that includes a polyolefin having at least one melting peak greater than 125 C, the top facial surface of layer C in adhering contact with the bottom
(Continued)

View of Three-Layer Backsheet and Encapsulant on Electronic Device facial surface of layer B. Such multilayer film structure preferably includes (A) a seal layer A having a bottom facial surface in adhering contact with the top facial surface of layer B. Such films are suited for use in electronic device (ED) modules including an electronic device such as a PV cell.

19 Claims, 1 Drawing Sheet

Related U.S. Application Data

(60) Provisional application No. 61/503,335, filed on Jun. 30, 2011.

(51) Int. Cl.
| | | |
|---|---|---|
| B32B 27/08 | (2006.01) | |
| H01L 31/18 | (2006.01) | |
| B29C 41/00 | (2006.01) | |
| B29C 41/26 | (2006.01) | |
| B29C 41/32 | (2006.01) | |
| B32B 37/18 | (2006.01) | |
| C08L 53/00 | (2006.01) | |
| H01L 31/048 | (2014.01) | |
| B29K 23/00 | (2006.01) | |
| B29L 9/00 | (2006.01) | |

(52) U.S. Cl.
CPC ............ *B29C 41/32* (2013.01); *B32B 27/08* (2013.01); *B32B 27/32* (2013.01); *B32B 37/185* (2013.01); *C08L 53/00* (2013.01); *H01L 31/0481* (2013.01); *H01L 31/18* (2013.01); *B29K 2023/06* (2013.01); *B29K 2023/0625* (2013.01); *B29L 2009/00* (2013.01); *B32B 2270/00* (2013.01); *B32B 2323/04* (2013.01); *B32B 2457/12* (2013.01); *C08L 2203/204* (2013.01); *C08L 2205/025* (2013.01); *C08L 2205/03* (2013.01); *C08L 2205/035* (2013.01); *C08L 2205/12* (2013.01); *Y02E 10/50* (2013.01)

(58) Field of Classification Search
CPC .... C09J 123/0807; C09J 153/00; C09J 11/06; C09J 123/16
See application file for complete search history.

(56) References Cited

U.S. PATENT DOCUMENTS

| | | | |
|---|---|---|---|
| 3,565,985 A | 2/1971 | Schrenk et al. | |
| 3,629,368 A | 12/1971 | Fukuda | |
| 3,884,606 A | 5/1975 | Schrenk | |
| 4,842,791 A | 6/1989 | Gould et al. | |
| 4,921,646 A | 5/1990 | Stewart | |
| 4,950,541 A | 8/1990 | Tabor et al. | |
| 5,094,788 A | 3/1992 | Schrenk et al. | |
| 5,094,793 A | 3/1992 | Schrenk et al. | |
| 5,194,509 A | 3/1993 | Hasenbein et al. | |
| 5,272,236 A | 12/1993 | Lai et al. | |
| 5,278,272 A | 1/1994 | Lai et al. | |
| 5,708,083 A | 1/1998 | Kawamura | |
| 5,783,638 A | 7/1998 | Lai et al. | |
| 5,844,045 A | 12/1998 | Kolthammer et al. | |
| 5,869,575 A | 2/1999 | Kolthammer et al. | |
| 5,986,028 A | 11/1999 | Lai et al. | |
| 6,448,341 B1 | 9/2002 | Kolthammer et al. | |
| 6,521,825 B2 | 2/2003 | Miura et al. | |
| 6,538,070 B1 | 3/2003 | Cardwell et al. | |
| 6,545,088 B1 | 4/2003 | Kolthammer et al. | |
| 6,566,446 B1 | 5/2003 | Parikh et al. | |
| 6,586,271 B2 | 7/2003 | Hanoka | |
| 6,685,872 B2 | 2/2004 | Dooley et al. | |
| 7,355,089 B2 | 4/2008 | Chang et al. | |
| 7,713,636 B2 | 5/2010 | Song et al. | |
| 8,431,235 B2 | 4/2013 | Chu et al. | |
| 8,481,154 B2 | 7/2013 | Chu et al. | |
| 2001/0045229 A1 | 11/2001 | Komori et al. | |
| 2006/0199006 A1 | 9/2006 | Poon et al. | |
| 2006/0199030 A1 | 9/2006 | Liang et al. | |
| 2006/0199744 A1 | 9/2006 | Walton et al. | |
| 2006/0199872 A1 | 9/2006 | Prieto et al. | |
| 2006/0199884 A1 | 9/2006 | Hoenig et al. | |
| 2006/0199887 A1 | 9/2006 | Liang et al. | |
| 2006/0199896 A1 | 9/2006 | Walton et al. | |
| 2006/0199897 A1 | 9/2006 | Karjala et al. | |
| 2006/0199905 A1 | 9/2006 | Hughes et al. | |
| 2006/0199906 A1 | 9/2006 | Walton et al. | |
| 2006/0199908 A1 | 9/2006 | Cheung et al. | |
| 2006/0199910 A1 | 9/2006 | Walton et al. | |
| 2006/0199912 A1 | 9/2006 | Fuchs et al. | |
| 2006/0199914 A1 | 9/2006 | Harris et al. | |
| 2006/0199930 A1 | 9/2006 | Li Pi Shan et al. | |
| 2006/0199931 A1 | 9/2006 | Poon et al. | |
| 2006/0199983 A1 | 9/2006 | Kammerhofer et al. | |
| 2007/0167578 A1 | 7/2007 | Arriola et al. | |
| 2008/0115825 A1 | 5/2008 | Patel | |
| 2008/0213519 A1 | 9/2008 | Masuura et al. | |
| 2008/0269412 A1 | 10/2008 | Carnahan et al. | |
| 2008/0311812 A1 | 12/2008 | Arriola et al. | |
| 2010/0108128 A1 | 5/2010 | Chu et al. | |
| 2011/0048512 A1 | 3/2011 | Chu et al. | |
| 2011/0082249 A1 | 4/2011 | Shan et al. | |
| 2011/0082257 A1 | 4/2011 | Carnahan et al. | |
| 2011/0082258 A1 | 4/2011 | Walton et al. | |
| 2011/0313107 A1 | 12/2011 | Shan et al. | |
| 2011/0313108 A1 | 12/2011 | Shan et al. | |

FOREIGN PATENT DOCUMENTS

| | | |
|---|---|---|
| WO | 1999/004971 A2 | 2/1999 |
| WO | 1999/005206 A2 | 2/1999 |
| WO | 2005/090426 A1 | 9/2005 |
| WO | 2005/090427 A1 | 9/2005 |
| WO | 2008/008875 A2 | 1/2008 |
| WO | 2008/036707 A2 | 3/2008 |
| WO | 2009/012215 A1 | 1/2009 |
| WO | 2010/053936 A1 | 5/2010 |
| WO | 2010/096608 A2 | 8/2010 |
| WO | 2011/009568 A1 | 1/2011 |
| WO | 2011/041696 A1 | 4/2011 |
| WO | 2011/163187 A1 | 12/2011 |
| WO | 2012/044730 A1 | 4/2012 |
| WO | 2012/044732 A1 | 4/2012 |
| WO | 2013/003543 A1 | 1/2013 |
| WO | 2013/090396 A1 | 6/2013 |

OTHER PUBLICATIONS

PCT/US2012/044558, International Search Report and Written Opinion.

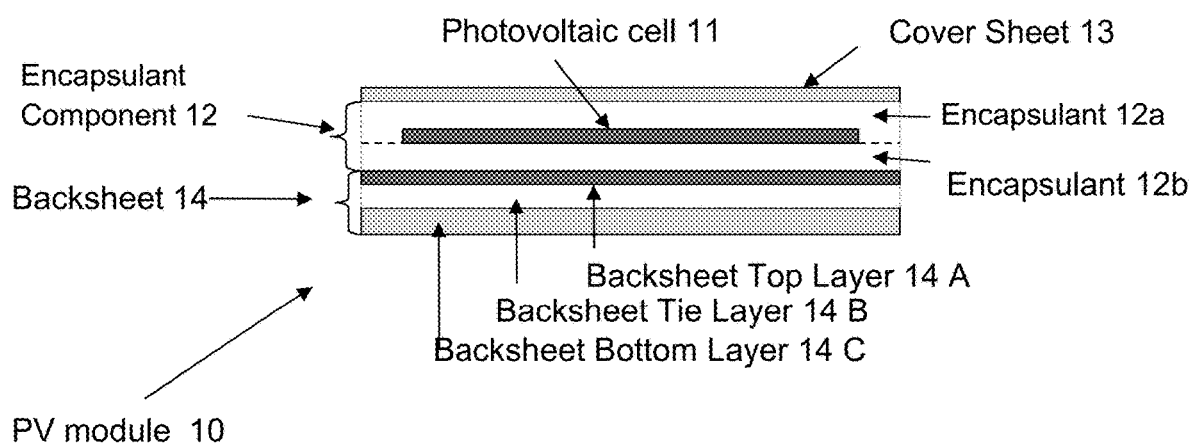
View of Three-Layer Backsheet and Encapsulant on Electronic Device

MULTILAYERED POLYOLEFIN-BASED FILMS HAVING A LAYER COMPRISING A CRYSTALLINE BLOCK COPOLYMER COMPOSITE OR A BLOCK COPOLYMER COMPOSITE RESIN

This application claims priority from provisional U.S. Patent application Ser. No. 61/503,335 filed Jun. 30, 2011 having the same title as this application; from U.S. patent application Ser. No. 61/570,464 filed Dec. 14, 2011 entitled, "FUNCTIONALIZED BLOCK COMPOSITE AND CRYSTALLINE BLOCK COMPOSITE COMPOSITIONS AS COMPATIBILIZERS" and from U.S. patent application filed Dec. 14, 2011 Ser. No. 61/570,340 entitled, "FUNCTIONALIZED BLOCK COMPOSITE AND CRYSTALLINE BLOCK COMPOSITE COMPOSITIONS". This application is related to commonly assigned and U.S. Patent application Ser. No. 61/503,326 filed the same date herewith and entitled "MULTILAYERED POLYOLEFIN-BASED FILMS HAVING INTEGRATED BACKSHEET AND ENCAPSULATION PERFORMANCE COMPRISING A LAYER COMPRISING CRYSTALLINE BLOCK COPOLYMER COMPOSITE OR BLOCK COPOLYMER COMPOSITE" and claiming priority from provisional U.S. Patent application Ser. No. 61/503,326.

This invention relates to films having a layer comprising a Crystalline Block Composite ("CBC") or a specified Block Composite ("BC") and having improved combinations of properties; being particularly suited for use as protective layers, for example "backsheets", in electronic device (ED) modules, e.g., photovoltaic (PV) modules. In one aspect, the invention relates to the backsheet films for use in such modules. In another aspect, the invention relates to co-extruded, multilayered films of this type. In still another aspect, the invention relates to the ED module incorporating such a backsheet.

Thermoplastic polymeric material films, often referred to as plastic films, are commonly used as layers in the manufacture of modules or assemblies comprising one or more electronic devices including, but not limited to, solar cells (also known as photovoltaic (PV) cells), batteries, liquid crystal panels, electro-luminescent devices and plasma display units. The modules often comprise an electronic device in combination with one or more substrates, often positioned between two substrates, in which one or both of the substrates comprise, as support(s), glass, metal, plastic, rubber or another material. The terminology for the names and descriptions of the ED component layers varies somewhat between different writers and different producers but polymeric film materials are typically used as internally located "encapsulant" or "sealant" layers for the device itself or, depending upon the design of the device, as outer "cover" or "skin" layer components of the module.

PV modules are well known in the art, and typically comprise the following components that are assembled into the final module structure:
 1. a stiff or flexible transparent cover layer,
 2. a front transparent encapsulant,
 3. a PV (solar) cell,
 4. a rear encapsulant (typically the same composition as the front encapsulant) and
 5. a backsheet.

The present invention is concerned with improved films or film layers utilizing a crystalline block copolymer composite or a specific block copolymer composite in a layer that in turn provides improved PV modules in terms of cost effectiveness and performance. Backsheet layers, as discussed in more detail below, protect the back surface of the cell and may have additional features that enhance the performance of the PV module.

Examples of some of the types of backsheet products that are currently in commercial use are TPE-type structures (a PVF/PET/EVA laminate) available from Madico, and Icosolar 2442 (a PVF/PET/PVF laminate) available from Isovolta; and PPE-type structures (PET/PET/EVA) structure available from Dunmore. A number of proposed improved and enhanced backsheets are also disclosed including the following.

In U.S. Pat. No. 6,521,825 solar cell module backsheet layers are disclosed having two heat and weather resistant layers with a moisture resistant core layer.

In U.S. Pat. No. 7,713,636B2 multi-layer films comprising propylene-based polymers are disclosed having improved peel strength properties and comprising a core layer and a first tie layer made from at least 5 wt % of a grafted propylene-based polymer.

WO 2010/053936 discloses backsheet layers for electronic device (ED) modules, e.g., photovoltaic (PV) modules, having at least three layers including a tie layer of a glycidyl methacrylate (GMA) graft resin joining layers that each use a maleic anhydride modified resin (MAH-m resin) in each of the joined layers to provide good interlayer adhesion.

US 2011/0048512 discloses backsheet layers for electronic device (ED) modules, e.g., photovoltaic (PV) modules, comprising a coextruded multilayer sheet that comprises: i) an inner layer comprising a polyolefin resin; ii) a core layer comprising a polypropylene resin, a blend of a polypropylene resin and a maleic anhydride grafted polypropylene (MAH-g-PP), or a polypropylene resin/MAH-g-PP multilayer structure; iii) an outer layer comprising a maleic anhydride grafted polyvinylidene fluoride (MAH-g-PVDF), a blend of a polyvinylidene fluoride (PVDF) and a MAH-g-PVDF, or a PVDF/MAH-g-PVDF multilayer structure; iv) a first tie layer between the core layer and the outer layer; and v) an optional second tie layer between the core layer and the inner layer.

In WO/2011/009568 there are disclosed photovoltaic module backsheets on base of preferably high molecular weight, impact resistant, shrinkage and thermal (flow) resistant FPP (Flexible Polypropylene) compositions preferably containing functional particles or being coextruded with a primer adhesive layer to obtain highly reliable adhesion on EVA adhesive layers. In one embodiment, the backsheet has a functionalized polyolefin (PO) adhesive layer allowing direct adhesion to cells back-contacts, i.e. without the use of an EVA adhesive layer. In a further embodiment, the backsheet, with functional PO adhesive layer, allows the use of an upper adhesive layer which has s a transparent thermoplastic polyolefin (TPO) film layer.

Noting the issues and limitations involved with the use of the prior art components in electronic devices such as PV modules, there is always a continuing desire for improved and lower cost electronic devices such as PV modules that can be obtained by use of improved components in their construction. In particular, better interlayer adhesion of backsheet layers and substantial reduction or elimination of interlayer failure between backsheet layers in PV modules is expected to increase lifetime of PV modules.

SUMMARY OF THE INVENTION

Therefore, according to one embodiment of the present invention, there is provided a multilayer film structure comprising a layer (Layer B) and a bottom layer (Layer C), each layer having opposing facial surfaces in adhering contact with the other layer, wherein:

B. Layer B comprises a crystalline block copolymer composite (CBC) or a specified block copolymer composite (BC), comprising:
  i) an ethylene polymer (EP) comprising at least 80 mol % polymerized ethylene;
  ii) an alpha-olefin-based crystalline polymer (CAOP) and
  iii) a block copolymer comprising (a) an ethylene polymer block comprising at least 80 mol % polymerized ethylene and (b) a crystalline alpha-olefin block (CAOB), or a mixture of said composite(s); and
C. bottom Layer C comprises a polyolefin having at least one melting peak greater than 125° C. and having a top facial layer and a bottom facial surface, the top facial surface of Layer C in adhering contact with the bottom facial surface of Layer B.

In other alternative independent embodiments related to Layer B, there are provided multilayer film structures as described above where: the i) EP in Layer B comprises at least 80 mol % polymerized ethylene and the balance polymerized propylene and, preferably wherein the block composite resin in Layer B is a crystalline block composite resin; the Layer B block composite resin has a CAOB amount (in part (iii)) in the range of from 30 to 70 weight % of the CAOB, preferably from 40 to 60 weight % of the CAOB; Layer B comprises a CBC having a CBCI of between 0.3 to 1.0 or a specified BC having a BCI of between 0.1 to 1.0; propylene is the alpha-olefin in ii) and iii) in tie Layer B; tie Layer B is a blend comprising greater than 40 weight percent CBC or specified BC, preferably further comprising one or more polyolefin selected from an ethylene octene plastomer, LLDPE and LDPE; and/or the CBC or specified BC of Layer B has a melt flow rate of from 3 to 15 g/10 min (at 230° C./2.16 Kg).

In other alternative independent embodiments, there are provided multilayer film structures as described herein comprising: (A) a seal layer A having a top facial surface and a bottom facial surface, the bottom facial surface in adhering contact with the top facial surface of layer B; preferably such a film in which the top layer A comprises a linear low density polyethylene (LLDPE) and more preferably such a film in which the top layer A comprises a blend formulation of a linear low density polyethylene (LLDPE) comprising a polar ethylene copolymer in an amount of from 10 to 45 weight %. Optionally in such films the top layer A comprises a BC or CBC and the layer composition is different from layer B composition.

In other alternative independent embodiments, there are provided multilayer film structures as described above where the bottom layer C comprises: a propylene-based polymer or optionally a propylene-based polymer having a heat of fusion value of at least 60 Joules per gram (J/g). A further independent embodiment of the present invention is a multilayer structure as described herein wherein Layer A is from 0 to 200 micrometer (μm) in thickness; Layer B is from 25 to 100 μm in thickness; and Layer C is from 150 to 350 μm in thickness.

A further independent embodiment of the present invention is a multilayer film structure as described herein comprising a top seal Layer A comprising a blend formulation of a linear low density polyethylene (LLDPE) comprising a polar ethylene copolymer in an amount of from 10 to 45 weight %, a bottom Layer C comprising a propylene-based polymer and a Layer B between Layer A and Layer C comprising a crystalline block copolymer composite (CBC) comprising i) an ethylene polymer (EP) comprising at least 93 mol % polymerized ethylene; ii) a crystalline propylene polymer and iii) a block copolymer comprising (a) an ethylene polymer block comprising at least 93 mol % polymerized ethylene and (b) a crystalline propylene polymer block.

A further independent embodiment of the present invention is an electronic device (ED) module comprising an electronic device and a multilayer film structure as described above.

A further independent embodiment of the present invention is a lamination process to construct a laminated PV module comprising the steps of:
(1.) bringing at least the following layers into facial contact in the following order:
  (a) a light-receiving top sheet layer having an exterior light-receiving facial surface and an interior facial surface;
  (b) a light transmitting thermoplastic polymer encapsulation layer, having one facial surface directed toward the top sheet layer and one directed toward a light-reactive surface of a PV cell; (c) a PV cell have a light reactive surface; (d) a second encapsulating film layer; and (e) a backsheet layer comprising a multilayer film structure according to claim 1; and
(2.) heating and compressing the layers of Step (1.) at conditions sufficient to create the needed adhesion between the layers and, if needed in some layers or materials, initiation of their crosslinking.

BRIEF DESCRIPTION OF THE DRAWINGS

FIG. 1 is a cross-sectional view of an exemplary three-layer backsheet in adhering contact with an encapsulant layer on the back surface of an electronic device.

DETAILED DESCRIPTION

One of the important features of the films of the present invention is use of a layer that comprises a block composite resin comprising: i) an ethylene-based polymer; ii) an alpha-olefin-based crystalline polymer (which is preferably based on propylene) and iii) a block copolymer comprising an ethylene block and a crystalline alpha-olefin (preferably propylene) block. In discussing the polymer components of the film layers and films of present invention there are several terms that are frequently used and are defined and understood as follows.

Polymer Resins Descriptions and Terms

"Composition" and like terms mean a mixture of two or more materials, such as a polymer which is blended with other polymers or which contains additives, fillers, or the like. Included in compositions are pre-reaction, reaction and post-reaction mixtures the latter of which will include reaction products and by-products as well as unreacted components of the reaction mixture and decomposition products, if any, formed from the one or more components of the pre-reaction or reaction mixture.

"Blend", "polymer blend" and like terms mean a composition of two or more polymers. Such a blend may or may not be miscible. Such a blend may or may not be phase separated. Such a blend may or may not contain one or more domain configurations, as determined from transmission electron spectroscopy, light scattering, x-ray scattering, and any other method known in the art. Blends are not laminates, but one or more layers of a laminate may contain a blend.

"Polymer" means a compound prepared by polymerizing monomers, whether of the same or a different type. The generic term polymer thus embraces the term homopolymer, usually employed to refer to polymers prepared from only one type of monomer, and the term interpolymer as defined below. It also embraces all forms of interpolymers, e.g., random, block, etc. The terms "ethylene/α-olefin polymer" and "propylene/α-olefin polymer" are indicative of interpolymers as described below. It is noted that although a polymer is often referred to as being "made of" monomers, "based on" a specified monomer or monomer type, "containing" a specified monomer content, or the like, this is obviously understood to be referring to the polymerized remnant of the specified monomer and not to the unpolymerized species.

"Interpolymer" means a polymer prepared by the polymerization of at least two different monomers. This generic term includes copolymers, usually employed to refer to polymers prepared from two or more different monomers, and includes polymers prepared from more than two different monomers, e.g., terpolymers, tetrapolymers, etc.

"Polyolefin", "polyolefin polymer", "polyolefin resin" and like terms mean a polymer produced from a simple olefin (also called an alkene with the general formula $C_nH_{2n}$) as a monomer. Polyethylene is produced by polymerizing ethylene with or without one or more comonomers, polypropylene by polymerizing propylene with or without one or more comonomers, etc. Thus, polyolefins include interpolymers such as ethylene/α-olefin copolymers, propylene/α-olefin copolymers, etc.

"(Meth)" indicates that the methyl substituted compound is included in the term. For example, the term "ethylene-glycidyl (meth)acrylate" includes ethylene-glycidyl acrylate (E-GA) and ethylene-glycidyl methacrylate (E-GMA), individually and collectively.

"Melting Point" as used here (also referred to a melting peak in reference to the shape of the plotted DSC curve) is typically measured by the DSC (Differential Scanning Calorimetry) technique for measuring the melting points or peaks of polyolefins as described in U.S. Pat. No. 5,783,638. It should be noted that many blends comprising two or more polyolefins will have more than one melting point or peak; many individual polyolefins will comprise only one melting point or peak.

Layer C—High Melting Point Polyolefin Resins

The polyolefin resins useful in the bottom layer or Layer C of the backsheet have a melting point of at least 125° C., preferably greater than 130 C, preferably greater than 140° C., more preferably greater than 150° C. and even more preferably greater than 160° C. These polyolefin resins are preferably propylene-based polymers, commonly referred to as polypropylenes. These polyolefins are preferably made with multi-site catalysts, e.g., Zeigler-Natta and Phillips catalysts. In general, polyolefin resins with a melting point of at least 125° C. often exhibit desirable toughness properties useful in the protection of the electronic device of the module.

Regarding polyolefin resins in general, such as suitable for Layer C or for other olefin polymer components of the present invention, the sole monomer (or the primary monomer in the case of interpolymers) is typically selected from ethylene, propene (propylene), 1-butene, 4-methyl-1-pentene, 1-hexene, 1-octene, 1-decene, 1-dodecene, 1-tetradecene, 1-hexadecene, and 1-octadecene and is preferably propylene for the Layer C polyolefin resin. If the polyolefin resin is an interpolymer, then the comonomer(s) different from the first or primary monomer is/are typically one or more α-olefins. For purposes of this invention, ethylene is an α-olefin if propylene or higher olefin is the primary monomer. The co-α-olefin is then preferably a different $C_{2-20}$ linear, branched or cyclic α-olefin. Examples of $C_{2-20}$ α-olefins for use as comonomers include ethylene, propene (propylene), 1-butene, 4-methyl-1-pentene, 1-hexene, 1-octene, 1-decene, 1-dodecene, 1-tetradecene, 1-hexadecene, and 1-octadecene. The α-olefins for use as comonomers can also contain a cyclic structure such as cyclohexane or cyclopentane, resulting in an α-olefin such as 3-cyclohexyl-1-propene (allyl cyclohexane) and vinyl cyclohexane. Although not α-olefins in the classical sense of the term, for purposes of this invention certain cyclic olefins, such as norbornene and related olefins, are α-olefins and can be used as comonomer in place of some or all of the α-olefins described above. Similarly, styrene and its related olefins (for example, α-methylstyrene, etc.) are α-olefins for purposes of comonomers according to this invention. Acrylic and methacrylic acid and their respective ionomers, and acrylates and methacrylates are also comonomer α-olefins for purposes of this invention. Illustrative polyolefin copolymers include but are not limited to ethylene/propylene, ethylene/butene, ethylene/1-hexene, ethylene/1-octene, ethylene/styrene, ethylene/acrylic acid (EAA), ethylene/methacrylic acid (EMA), ethylene/acrylate or methacrylate, EVA and the like. Illustrative terpolymers include ethylene/propylene/1-octene, ethylene/propylene/butene, ethylene/butene/1-octene, and ethylene/butene/styrene. The copolymers can be random or blocky.

The high melting point polyolefin resins (having a melting point of at least 125° C.), that are useful in the present invention and preferred for use as all or most of bottom layer Layer C in the practice of this invention include propylene-based polymers, also referred to as propylene polymers or polypropylenes, including e.g., polypropylene or propylene copolymers comprising a majority of units derived from propylene and a minority of units derived from another α-olefin (including ethylene). These propylene-based polymers include polypropylene homopolymer, copolymers of propylene and one or more other olefin monomers, a blend of two or more homopolymers or two or more copolymers, and a blend of one or more homopolymer with one or more copolymer, as long as it has a melting point of 125° C. or more. The polypropylene-based polymers can vary widely in form and include, for example, substantially isotactic propylene homopolymer, random propylene copolymers, and graft or block propylene copolymers.

The propylene copolymers preferably comprise at least 85, more preferably at least 87 and even more preferably at least 90, mole percent units derived from propylene. The remainder of the units in the propylene copolymer is derived from units of at least one α-olefin having up to 20, preferably up to 12 and more preferably up to 8, carbon atoms. The α-olefin is preferably a $C_{3-20}$ linear, branched or cyclic α-olefin as described above.

In general, preferred propylene polymer resins include hompolymer polypropylenes, preferably high crystallinity polypropylene such as high stiffness and toughness polypropylenes. Preferably the propylene polymer MFR (measured in dg/min at 230° C./2.16 kg,) is at least 0.5, preferably at least 1.5, and more preferably at least 2.5 dg/min and less than or equal to 25, preferably less than or equal to 20, and most preferably less than or equal to 18 dg/min.

In general, preferred propylene polymer resins for Layer C have heat of fusion values (reflecting the relatively higher crystallinity) as measured by DSC of at least about 60 Joules per gram (J/g), more preferably at least about 90 J/g, still more preferably at least about 110 J/g and most preferably at least about 120 J/g. For the heat of fusion measurements, as generally known and performed by practitioners in this area, the DSC is run as generally described below under nitrogen at 10° C./min from 23° C. to 220° C., held isothermal at 220° C. for 3 minutes, dropped to 23° C. at 10° C./min and ramped back to 220° C. at 10° C./min. The second heat data is used to calculate the heat of fusion of the melting transition.

The following are illustrative but non-limiting propylene polymers that can be used in the backsheets of this invention: a propylene impact copolymer including but not limited to former DOW Polypropylene T702-12N; a propylene homopolymer including but not limited to former DOW Polypropylene H502-25RZ; and a propylene random copolymer including but not limited to former DOW Polypropylene R751-12N. It should be noted that the propylene polymer products above and other that were formerly available from The Dow Chemical Company may now be available from Braskem or correspond to products available from Braskem. Other polypropylenes include some of the VERSIFY® polymers available from The Dow Chemical Company, the VISTAMAXX® polymers available from ExxonMobil Chemical Company, and the PRO-FAX polymers available from Lyondell Basell Industries, e.g., PROFAe SR-256M, which is a clarified propylene copolymer resin with a density of 0.90 g/cc and a MFR of 2 g/10 min, PROFAX™ 8623, which is an impact propylene copolymer resin with a density of 0.90 g/cc and a MFR of 1.5 g/10 min. Still other propylene resins include CATALLOY™ in-reactor blends of polypropylene (homo- or copolymer) with one or more of propylene-ethylene or ethylene-propylene copolymer (all available from Basell, Elkton, Md.), Shell's KF 6100 propylene homopolymer; Solvay's KS 4005 propylene copolymer; and Solvay's KS 300 propylene terpolymer. Furthermore, INSPIRE™ D114, which is a branched impact copolymer polypropylene with a melt flow rate (MFR) of 0.5 dg/min (230° C./2.16 kg) and a melting point of 164° C. would be a suitable polypropylene. In general, suitable high crystallinity polypropylene with high stiffness and toughness include but are not limited to INSPIRE™ 404 with an MFR of 3 dg/min, and INSPIRE™ D118.01 with a melt flow rate of 8.0 dg/min (230° C./2.16 kg), (both also formerly available from The Dow Chemical Company).

Propylene polymer blend resins can also be used where polypropylene resins as described above can be blended or diluted with one or more other polymers, including polyolefins as described below, to the extent that the other polymer is (i) miscible or compatible with the polypropylene, (ii) has little, if any, deleterious impact on the desirable properties of the polypropylene, e.g., toughness and modulus, and (iii) the polypropylene constitutes at least 55, preferably at least 60, more preferably at least 65 and still more preferably at least 70, weight percent of the blend. The propylene polymer can be also be blended with cyclic olefin copolymers such as Topas 6013F-04 cyclic olefin copolymer available from Topas Advanced Polymers, Inc. with preferred amounts when used at least 2, preferably 4, and more preferably 8 weight percent up to and including to 40, preferably 35 and more preferably 30 weight percent. In general, propylene polymer resins for Layer C can comprise an impact modifier such as ethylene octene plastomers such as AFFINITY PL 1880G, PL8100G, and PL 1850G brand resins or ethylene octene elastomers such as ENGAGE 8842, ENGAGE 8150, and ENGAGE XLT 8677 brand resins commercially available from The Dow Chemical Company, olefin block copolymers such as for example INFUSE 9100 and 9107 brand resins commercially available from The Dow Chemical Company or propylene based elastomers such as VERSIFY 2300 and VERSIFY 3300 brand resins available from The Dow Chemical Company. In general, these are used in amounts at least of 2 weight percent, preferably at least 5 and more preferably at least 8 weight percent and preferably less than 45 weight %, preferably less than 35 weight percent and more preferably less than 30 weight percent. Other candidate impact modification or blend resins are ethylene/propylene rubbers (optionally blended with polypropylene in-reactor) and one or more block composites as described herein. Combinations of impact modifiers of different types may also be used.

Other additives that could be used with the propylene polymer resins are inorganic fillers such as talc (including epoxy coated talc), colorants, flame retardants (halogenated and non-halogenated) and flame retardant synergists such as $Sb_2O_3$.

Layer B Crystalline Block Copolymer Composite and Block Copolymer Composite Resin Components The composition of Layer B in the films according to the present invention, often referred to as a "tie" layer, is selected to be adhered, either preferably by co-extrusion or alternatively but less preferably by a lamination process (such as extrusion lamination, thermal lamination, or adhesive lamination) to the layers C and optionally A (or optionally another layer) in production of the films according to the invention. As mentioned above, Layer B comprises a Crystalline Block Copolymer Composite Resin ("CBC") and/or certain Block copolymer Composite Resins ("BC's"), CBC's and BC's collectively referred to herein as "Crystalline Block and Block Composite Resins" "Composite Resins" or "(C)BC's". Layer B can alternatively comprise a blend of one or more CBC and with one or more BC, or a blend of one or both of these resins with one or more other resin.

The term "block copolymer" or "segmented copolymer" refers to a polymer comprising two or more chemically distinct regions or segments (referred to as "blocks") joined in a linear manner, that is, a polymer comprising chemically differentiated units which are joined (covalently bonded) end-to-end with respect to polymerized functionality, rather than in pendent or grafted fashion. In a preferred embodiment, the blocks differ in the amount or type of comonomer incorporated therein, the density, the amount of crystallinity, the type of crystallinity (e.g. polyethylene versus polypropylene), the crystallite size attributable to a polymer of such composition, the type or degree of tacticity (isotactic or syndiotactic), regio-regularity or regio-irregularity, the amount of branching, including long chain branching or hyper-branching, the homogeneity, or any other chemical or physical property. The block copolymers of the invention are characterized by unique distributions of both polymer polydispersity (PDI or Mw/Mn) and block length distribution, due, in a preferred embodiment, to the effect of a shuttling agent(s) in combination with the catalyst(s).

As used herein, the terms "block composite" or "block copolymer composite" resins are different from "crystalline block composites" or "crystalline block copolymer composite resins" based on the amount of comonomer polymerized with the ethylene polymer and ethylene block in the composite. The term "BC" refers generally to polymers comprising (i) a soft ethylene copolymer (EP) having polymerized units in which the comonomer content is greater than 10 mol % and having less than 90 mol % polymerized ethylene, and preferably greater than 20 mol % and less than 80 mol % ethylene, and most preferably greater than 33 mol % and less than 75 mol ethylene %, (ii) a hard or crystalline α-olefin polymer (CAOP), in which the α-olefin monomer (preferably propylene) is present in an amount of from greater than 90 up to 100 mol percent, and preferably greater than 93 mol percent, and more preferably greater than 95 mol percent, and most preferably greater than 98 mol percent and (iii) a block copolymer, preferably a diblock, having a soft segment and a hard segment, wherein the hard segment of the block copolymer is essentially the same composition as the hard α-olefin polymer in the block composite and the soft segment of the block copolymer is essentially the same composition as the soft ethylene copolymer of the block composite. The block copolymers can be linear or branched. More specifically, when produced in a continuous process, the block composites desirably possess PDI from 1.7 to 15, preferably from 1.8 to 3.5, more preferably from 1.8 to 2.2, and most preferably from 1.8 to 2.1. When produced in a batch or semi-batch process, the block composites desirably possess PDI from 1.0 to 2.9, preferably from 1.3 to 2.5, more preferably from 1.4 to 2.0, and most preferably from 1.4 to 1.8. Such block composites are described in, for example, US Patent Application Publication Nos US2011-0082257, US2011-0082258 and US2011-0082249, all published on Apr. 7, 2011 and incorporated herein by reference with respect to descriptions of the block composites, processes to make them and methods of analyzing them.

As mentioned above, alternatively or in addition to the CBC (discussed in more detail below), certain suitable "BC" resins can be employed in Layer B in the films according to the present invention. The specific suitable "BC's" comprise a soft ethylene copolymer (EP) having the comonomer content greater than 80 mol % and up to 90 mol % and preferably greater than 85 mol % and most preferably greater than 87 mol %, but otherwise a BC as generally described herein.

The term "crystalline block composite" (CBC) (including the term "crystalline block copolymer composite") refers to polymers comprising a crystalline ethylene based polymer (CEP), a crystalline alpha-olefin based polymer (CAOP), and a block copolymer having a crystalline ethylene block (CEB) and a crystalline alpha-olefin block (CAOB), wherein the CEB of the block copolymer is essentially the same composition as the CEP in the block composite and the CAOB of the block copolymer is essentially the same composition as the CAOP of the block composite. Additionally, the compositional split between the amount of CEP and CAOP will be essentially the same as that between the corresponding blocks in the block copolymer. The block copolymers can be linear or branched. More specifically, each of the respective block segments can contain long chain branches, but the block copolymer segment is substantially linear as opposed to containing grafted or branched blocks. When produced in a continuous process, the crystalline block composites desirably possess PDI from 1.7 to 15, preferably 1.8 to 10, preferably from 1.8 to 5, more preferably from 1.8 to 3.5. Such crystalline block composites are described in, for example, the following filed patent applications: PCT/US11/41189; U.S. Ser. No. 13/165,054; PCT/US11/41191; U.S. Ser. No. 13/165,073; PCT/US11/41194; and U.S. Ser. No. 13/165,096; all filed on 21 Jun. 2011 and incorporated herein by reference with respect to descriptions of the crystalline block composites, processes to make them and methods of analyzing them.

CAOB refers to highly crystalline blocks of polymerized alpha olefin units in which the monomer is present in an amount greater than 90 mol %, preferably greater than 93 mol percent, more preferably greater than 95 mol percent, and preferably greater than 96 mol percent. In other words, the comonomer content in the CAOBs is less than 10 mol percent, and preferably less than 7 mol percent, and more preferably less than 5 mol percent, and most preferably less than 4 mol %. CAOBs with propylene crystallinity have corresponding melting points that are 80° C. and above, preferably 100° C. and above, more preferably 115° C. and above, and most preferably 120° C. and above. In some embodiments, the CAOB comprise all or substantially all propylene units. CEB, on the other hand, refers to blocks of polymerized ethylene units in which the comonomer content is 10 mol % or less, preferably between 0 mol % and 10 mol %, more preferably between 0 mol % and 7 mol % and most preferably between 0 mol % and 5 mol %. Such CEB have corresponding melting points that are preferably 75° C. and above, more preferably 90° C., and 100° C. and above.

"Hard" segments refer to highly crystalline blocks of polymerized units in which the monomer is present in an amount greater than 90 mol percent, and preferably greater than 93 mol percent, and more preferably greater than 95 mol percent, and most preferably greater than 98 mol percent. In other words, the comonomer content in the hard segments is most preferably less than 2 mol percent, and more preferably less than 5 mol percent, and preferably less than 7 mol percent, and less than 10 mol percent. In some embodiments, the hard segments comprise all or substantially all propylene units. "Soft" segments, on the other hand, refer to amorphous, substantially amorphous or elastomeric blocks of polymerized units in which the comonomer content is greater than 10 mol % and less than 90 mol % and preferably greater than 20 mol % and less than 80 mol %, and most preferably greater than 33 mol % and less than 75 mol %.

The BC's and/or CBC's are preferably prepared by a process comprising contacting an addition polymerizable monomer or mixture of monomers under addition polymerization conditions with a composition comprising at least one addition polymerization catalyst, a cocatalyst and a chain shuttling agent, said process being characterized by formation of at least some of the growing polymer chains under differentiated process conditions in two or more reactors operating under steady state polymerization conditions or in two or more zones of a reactor operating under plug flow polymerization conditions. In a preferred embodiment, the BC's and/or CBC's comprise a fraction of block polymer which possesses a most probable distribution of block lengths.

Suitable processes useful in producing the block composites and crystalline block composites may be found, for example, in US Patent Application Publication No. 2008/0269412, published on Oct. 30, 2008, which is herein incorporated by reference.

When producing a block polymer having a crystalline ethylene block (CEB) and a crystalline alpha-olefin block (CAOB) in two reactors or zones it is possible to produce the CEB in the first reactor or zone and the CAOB in the second reactor or zone or to produce the CAOB in the first reactor or zone and the CEB in the second reactor or zone. It is more advantageous to produce CEB in the first reactor or zone with fresh chain shuttling agent added. The presence of increased levels of ethylene in the reactor or zone producing CEB will typically lead to much higher molecular weight in that reactor or zone than in the zone or reactor producing CAOB. The fresh chain shuttling agent will reduce the MW of polymer in the reactor or zone producing CEB thus leading to better overall balance between the length of the CEB and CAOB segments.

When operating reactors or zones in series it is necessary to maintain diverse reaction conditions such that one reactor produces CEB and the other reactor produces CAOB. Carryover of ethylene from the first reactor to the second reactor (in series) or from the second reactor back to the first reactor through a solvent and monomer recycle system is preferably minimized. There are many possible unit operations to remove this ethylene, but because ethylene is more volatile than higher alpha olefins one simple way is to remove much of the unreacted ethylene through a flash step by reducing the pressure of the effluent of the reactor producing CEB and flashing off the ethylene. A more preferable approach is to avoid additional unit operations and to utilize the much greater reactivity of ethylene versus higher alpha olefins such that the conversion of ethylene across the CEB reactor approaches 100%. The overall conversion of monomers across the reactors can be controlled by maintaining the alpha olefin conversion at a high level (90 to 95%).

Suitable catalysts and catalyst precursors for use in preparing BC's and/or CBC's invention include metal complexes such as disclosed in WO2005/090426, in particular, those disclosed starting on page 20, line 30 through page 53, line 20, which is herein incorporated by reference. Suitable catalysts are also disclosed in US 2006/0199930; US 2007/0167578; US 2008/0311812; U.S. Pat. No. 7,355,089 B2; or WO 2009/012215, which are herein incorporated by reference with respect to catalysts.

Preferably, the BC's and/or CBC's comprise propylene, 1-butene or 4-methyl-1-pentene and one or more comonomers. Preferably, the block polymers of the BC's and CBC's comprise in polymerized form propylene and ethylene and/or one or more $C_{4-20}$ α-olefin comonomers, and/or one or more additional copolymerizable comonomers or they comprise 4-methyl-1-pentene and ethylene and/or one or more $C_{4-20}$ α-olefin comonomers, or they comprise 1-butene and ethylene, propylene and/or one or more $C_5$-$C_{20}$ α-olefin comonomers and/or one or more additional copolymerizable comonomers. Additional suitable comonomers are selected from diolefins, cyclic olefins, and cyclic diolefins, halogenated vinyl compounds, and vinylidene aromatic compounds.

Comonomer content in the resulting BC's and/or CBC's may be measured using any suitable technique, with techniques based on nuclear magnetic resonance (NMR) spectroscopy preferred. It is highly desirable that some or all of the polymer blocks comprise amorphous or relatively amorphous polymers such as copolymers of propylene, 1-butene or 4-methyl-1-pentene and a comonomer, especially random copolymers of propylene, 1-butene or 4-methyl-1-pentene with ethylene, and any remaining polymer blocks (hard segments), if any, predominantly comprise propylene, 1-butene or 4-methyl-1-pentene in polymerized form. Preferably such segments are highly crystalline or stereospecific polypropylene, polybutene or poly-4-methyl-1-pentene, especially isotactic homopolymers.

Further preferably, the block copolymers of the BC's and/or CBC's comprise from 10 to 90 weight percent crystalline or relatively hard segments and 90 to 10 weight percent amorphous or relatively amorphous segments (soft segments), preferably from 20 to 80 weight percent crystalline or relatively hard segments and 80 to 20 weight percent amorphous or relatively amorphous segments (soft segments), most preferably from 30 to 70 weight percent crystalline or relatively hard segments and 70 to 30 weight percent amorphous or relatively amorphous segments (soft segments). Within the soft segments, the mole percent comonomer may range from 10 to 90 mole percent, preferably from 20 to 80 mole percent, and most preferably from 33 to 75 mol % percent. In the case wherein the comonomer is ethylene, it is preferably present in an amount of 10 mol % to 90 mol %, more preferably from 20 mol % to 80 mol %, and most preferably from 33 mol % to 75 mol % percent. Preferably, the copolymers comprise hard segments that are 90 mol % to 100 mol % propylene. The hard segments can be greater than 90 mol % preferably greater than 93 mol % and more preferably greater than 95 mol % propylene, and most preferably greater than 98 mol % propylene. Such hard segments have corresponding melting points that are 80° C. and above, preferably 100° C. and above, more preferably 115° C. and above, and most preferably 120° C. and above.

In some embodiments, the block copolymer composites of the invention have a Block Composite Index (BCI), as defined below, that is greater than zero but less than 0.4 or from 0.1 to 0.3. In other embodiments, BCI is greater than 0.4 and up to 1.0. Additionally, the BCI can be in the range of from 0.4 to 0.7, from 0.5 to 0.7, or from 0.6 to 0.9. In some embodiments, BCI is in the range of from 0.3 to 0.9, from 0.3 to 0.8, or from 0.3 to 0.7, from 0.3 to 0.6, from 0.3 to 0.5, or from 0.3 to 0.4. In other embodiments, BCI is in the range of from 0.4 to 1.0, from 0.5 to 1.0, or from 0.6 to 1.0, from 0.7 to 1.0, from 0.8 to 1.0, or from 0.9 to 1.0.

The block composites preferably have a Tm greater than 100° C., preferably greater than 120° C., and more preferably greater than 125° C. Preferably the M FR of the block composite is from 0.1 to 1000 dg/min, more preferably from 0.1 to 50 dg/min and more preferably from 0.1 to 30 dg/min.

Further preferably, the block composites of this embodiment of the invention have a weight average molecular weight (Mw) from 10,000 to about 2,500,000, preferably from 35000 to about 1,000,000 and more preferably from 50,000 to about 300,000, preferably from 50,000 to about 200,000.

Preferably, the block composite polymers of the invention comprise ethylene, propylene, 1-butene or 4-methyl-1-pentene and optionally one or more comonomers in polymerized form. Preferably, the block copolymers of the crystalline block composites comprise in polymerized form ethylene, propylene, 1-butene, or 4-methyl-1-pentene and optionally one or more $C_{4-20}$ α-olefin comonomers. Additional suitable comonomers are selected from diolefins, cyclic olefins, and cyclic diolefins, halogenated vinyl compounds, and vinylidene aromatic compounds.

Comonomer content in the resulting block composite polymers may be measured using any suitable technique, with techniques based on nuclear magnetic resonance (NMR) spectroscopy preferred.

Preferably the crystalline block composite polymers of the invention comprise from 0.5 to 95 wt % CEP, from 0.5 to 95 wt % CAOP and from 5 to 99 wt % block copolymer. More preferably, the crystalline block composite polymers comprise from 0.5 to 79 wt % CEP, from 0.5 to 79 wt % CAOP and from 20 to 99 wt % block copolymer and more preferably from 0.5 to 49 wt % CEP, from 0.5 to 49 wt % CAOP and from 50 to 99 wt % block copolymer. Weight percents are based on total weight of crystalline block composite. The sum of the weight percents of CEP, CAOP and block copolymer equals 100%.

Preferably, the block copolymers of the invention comprise from 5 to 95 weight percent crystalline ethylene blocks (CEB) and 95 to 5 wt percent crystalline alpha-olefin blocks (CAOB). They may comprise 10 wt % to 90 wt % CEB and 90 wt % to 10 wt % CAOB. More preferably, the block copolymers comprise 25 to 75 wt % CEB and 75 to 25 wt % CAOB, and even more preferably they comprise 30 to 70 wt % CEB and 70 to 30 wt % CAOB.

In some embodiments, the block composites of the invention have a Crystalline Block Composite Index (CBCI), as defined below, that is greater than zero but less than 0.4 or from 0.1 to 0.3. In other embodiments, CBCI is greater than 0.4 and up to 1.0. In some embodiments, the CBCI is in the range of from 0.1 to 0.9, from 0.1 to 0.8, from 0.1 to 0.7 or from 0.1 to 0.6. Additionally, the CBCI can be in the range of from 0.4 to 0.7, from 0.5 to 0.7, or from 0.6 to 0.9. In some embodiments, CBCI is in the range of from 0.3 to 0.9, from 0.3 to 0.8, or from 0.3 to 0.7, from 0.3 to 0.6, from 0.3 to 0.5, or from 0.3 to 0.4. In other embodiments, CBCI is in the range of from 0.4 to 1.0, from 0.5 to 1.0, or from 0.6 to 1.0, from 0.7 to 1.0, from 0.8 to 1.0, or from 0.9 to 1.0.

Further preferably, the crystalline block composites of this embodiment of the invention have a weight average molecular weight (Mw) of 1,000 to about 2,500,000, preferably of 35000 to about 1,000,000 and more preferably of 50,000 to 500,000, of 50,000 to about 300,000, and preferably from 50,000 to about 200,000.

The overall composition of each resin is determined as appropriate by DSC, NMR, Gel Permeation Chromatography, Dynamic Mechanical Spectroscopy, and/or Transmission Electron Micrography. Xylene fractionation and high temperature liquid chromatography ("HTLC") fractionation can be further used to estimate the yield of block copolymer, and in particular the block composite index. These are described in more detail in US Patent Application Publication Nos US2011-0082257, US2011-0082258 and US2011-0082249, all published on Apr. 7, 2011 and incorporated herein by reference with respect to descriptions of the analysis methods.

For a block composite derived from ethylene and propylene, the insoluble fractions will contain an appreciable amount of ethylene that would not otherwise be present if the polymer was simply a blend of iPP homopolymer and EP copolymer. To account for this "extra ethylene", a mass balance calculation can be performed to estimate a block composite index from the amount of xylene insoluble and soluble fractions and the weight % ethylene present in each of the fractions.

A summation of the weight % ethylene from each fraction according to equation 1a results in an overall weight % ethylene (in the polymer). This mass balance equation can also be used to quantify the amount of each component in a binary blend or extended to a ternary, or n-component blend.

$$\text{Wt \% } C_{2_{Overall}} = w_{Insoluble}(\text{wt \% } C_{2_{Insoluble}}) + w_{soluble}(\text{wt \% } C_{2_{soluble}}) \quad \text{Eq. 1a}$$

Applying equations 2a through 4a, the amount of the soft block (providing the source of the extra ethylene) present in the insoluble fraction is calculated. By substituting the weight % $C_2$ of the insoluble fraction in the left hand side of equation 2a, the weight % iPP hard and weight % EP soft can be calculated using equations 3a and 4a. Note that the weight % of ethylene in the EP soft is set to be equal to the weight % ethylene in the xylene soluble fraction. The weight % ethylene in the iPP block is set to zero or if otherwise known from its DSC melting point or other composition measurement, the value can be put into its place.

$$\text{Wt \% } C_{2_{Overall \text{ or xylene insoluble}}} = w_{iPPHard}(\text{wt \% } C_{2_{iPP}}) + w_{EP \text{ soft}}(\text{wt \% } C_{2_{EPsoft}}) \quad \text{Eq. 2a}$$

$$w_{iPPhard} = \frac{\text{wt \% } C_{2_{overall \text{ or xylene insoluble}}} - \text{wt \% } C_{2_{EPsoft}}}{\text{wt \% } C_{2_{iPPhard}} - \text{wt \% } C_{2_{EPsoft}}} \quad \text{Eq. 3a}$$

$$w_{EPsoft} = 1 - w_{iPPHard} \quad \text{Eq. 4a}$$

After accounting for the 'additional' ethylene present in the insoluble fraction, the only way to have an EP copolymer present in the insoluble fraction, the EP polymer chain must be connected to an iPP polymer block (or else it would have been extracted into the xylene soluble fraction). Thus, when the iPP block crystallizes, it prevents the EP block from solubilizing.

To estimate the block composite index, the relative amount of each block must be taken into account. To approximate this, the ratio between the EP soft and iPP hard is used. The ratio of the EP soft polymer and iPP hard polymer can be calculated using Equation 2a from the mass balance of the total ethylene measured in the polymer. Alternatively it could also be estimated from a mass balance of the monomer and comonomer consumption during the polymerization. The weight fraction of iPP hard and weight fraction of EP soft is calculated using Equation 2a and assumes the iPP hard contains no ethylene. The weight % ethylene of the EP soft is the amount of ethylene present in the xylene soluble fraction.

For example, if an iPP-EP block composite contains an overall ethylene content of 47 wt % $C_2$ and is made under conditions to produce an EP soft polymer with 67 wt % $C_2$ and an iPP homopolymer containing zero ethylene, the amount of EP soft and iPP hard is 70 wt % and 30 wt %, respectively (as calculated using Equations 3a and 4a). If the percent of EP is 70 wt % and the iPP is 30 wt %, the relative ratio of the EP:iPP blocks could be expressed as 2.33:1.

Hence, if one skilled in the art carries out a xylene extraction of the polymer and recovers 40 wt % insoluble and 60 wt % soluble, this would be an unexpected result and this would lead to the conclusion that a fraction of block copolymer was present. If the ethylene content of the insoluble fraction is subsequently measured to be 25 wt % $C_2$, Equations 2a thru 4a can be solved to account for this additional ethylene and result in 37.3 wt % EP soft polymer and 62.7 wt % iPP hard polymer present in the insoluble fraction.

Since the insoluble fraction contains 37.3 wt % EP copolymer, it should be attached to an additional 16 wt % of iPP polymer based on the EP:iPP block ratio of 2.33:1. This brings the estimated amount of diblock in the insoluble fraction to be 53.3 wt %. For the entire polymer (unfractionated), the composition is described as 21.3 wt % iPP-EP Diblock, 18.7 wt % iPP polymer, and 60 wt % EP polymer. The term block composite index (BCI) is herein defined to equal the weight percentage of diblock divided by 100% (i.e. weight fraction). The value of the block composite index can range from 0 to 1, wherein 1 would be equal to 100% diblock and zero would be for a material such as a traditional blend or random copolymer. For the example described above, the block composite index for the block composite is 0.213. For the insoluble fraction, the BCI is 0.533, and for the soluble fraction the BCI is assigned a value of zero.

Depending on the estimations made of the total polymer composition and the error in the analytical measurements which are used to estimate the composition of the hard and soft blocks, between 5 to 10% relative error is possible in the computed value of the block composite index. Such estimations include the wt % C2 in the iPP hard block as measured from the DSC melting point, NMR analysis, or process conditions; the average wt % C2 in the soft block as estimated from the composition of the xylene solubles, or by NMR, or by DSC melting point of the soft block (if detected). But overall, the block composite index calculation reasonably accounts for the unexpected amount of 'additional' ethylene present in the insoluble fraction, the only way to have an EP copolymer present in the insoluble fraction, the EP polymer chain must be connected to an iPP polymer block (or else it would have been extracted into the xylene soluble fraction).

Crystalline block composites having CAOP and CAOB composed of crystalline polypropylene and a CEP and CEB composed of crystalline polyethylene cannot be fractionated by conventional means. Techniques based on solvent or temperature fractionation, for example, using xylene fractionation, solvent/non-solvent separation, temperature rising elution fractionation, or crystallization elution fractionation are not capable of resolving the block copolymer since the CEB and CAOB cocrystallize with the CEP and CAOP, respectively. However, using a method such as high temperature liquid chromatography which separates polymer chains using a combination of a mixed solvent/non-solvent and a graphitic column, crystalline polymer species such as polypropylene and polyethylene can be separated from each other and from the block copolymer.

For crystalline block composites, the amount of isolated PP is less than if the polymer was a simple blend of iPP homopolymer (in this example the CAOP) and polyethylene (in this case the CEP). Consequently, the polyethylene fraction contains an appreciable amount of propylene that would not otherwise be present if the polymer was simply a blend of iPP and polyethylene. To account for this "extra propylene", a mass balance calculation can be performed to estimate a crystalline block composite index from the amount of the polypropylene and polyethylene fractions and the weight % propylene present in each of the fractions that are separated by HTLC. The polymers contained within the crystalline block composite include iPP-PE diblock, unbound iPP, and unbound PE where the individual PP or PE components can contain a minor amount of ethylene or propylene respectively.

A summation of the weight % propylene from each component in the polymer according to equation 1 results in the overall weight % propylene (of the whole polymer). This mass balance equation can be used to quantify the amount of the iPP and PE present in the diblock copolymer. This mass balance equation can also be used to quantify the amount of iPP and PE in a binary blend or extended to a ternary, or n-component blend. For the crystalline block composite, the overall amount of iPP or PE is contained within the blocks present in the diblock and the unbound iPP and PE polymers.

$$\text{Wt \% C3}_{Overall} = w_{PP}(\text{wt \% C3}_{PP}) + w_{PE}(\text{wt \% C3}_{PE}) \quad \text{Eq. 1}$$

where
$w_{PP}$=weight fraction of PP in the polymer
$w_{PE}$=weight fraction of PE in the polymer
wt % $C3_{PP}$=weight percent of propylene in PP component or block
wt % $C3_{PE}$=weight percent of propylene in PE component or block Note that the overall weight % of propylene (C3) is preferably measured from C13 NMR or some other composition measurement that represents the total amount of C3 present in the whole polymer. The weight % propylene in the iPP block (wt % $C3_{PP}$) is set to 100 or if otherwise known from its DSC melting point, NMR measurement, or other composition estimate, that value can be put into its place. Similarly, the weight % propylene in the PE block (wt % $C3_{PE}$) is set to 100 or if otherwise known from its DSC melting point, NMR measurement, or other composition estimate, that value can be put into its place.

Based on equation 1, the overall weight fraction of PP present in the polymer can be calculated using Equation 2 from the mass balance of the total C3 measured in the polymer. Alternatively, it could also be estimated from a mass balance of the monomer and comonomer consumption during the polymerization. Overall, this represents the amount of PP and PE present in the polymer regardless of whether it is present in the unbound components or in the diblock copolymer. For a conventional blend, the weight fraction of PP and weight fraction of PE corresponds to the individual amount of PP and PE polymer present. For the crystalline block composite, it is assumed that the ratio of the weight fraction of PP to PE also corresponds to the average block ratio between PP and PE present in this statistical block copolymer.

$$w_{PP} = \frac{\text{wt \% C3}_{Overall} - \text{wt \% C3}_{PE}}{\text{wt \% C3}_{PP} - \text{wt \% C3}_{PE}} \quad \text{Eq. 2}$$

where
$w_{PP}$=weight fraction of PP present in the whole polymer
wt % $C3_{PP}$=weight percent of propylene in PP component or block
wt % $C3_{PE}$=weight percent of propylene in PE component or block Applying equations 3 through 5, the amount of the isolated PP that is measured by HTLC analysis is used to determine the amount of polypropylene present in the diblock copolymer. The amount isolated or separated first in the HTLC analysis represents the 'unbound PP' and its composition is representative of the PP hard block present in the diblock copolymer. By substituting the overall weight % C3 of the whole polymer in the left hand side of equation 3, and the weight fraction of PP (isolated from HTLC) and the weight fraction of PE (separated by HTLC) into the right hand side of equation 3, the weight % of C3 in the PE fraction can be calculated using equations 4 and 5. The PE fraction is described as the fraction separated from the unbound PP and contains the diblock and unbound PE. The composition of the isolated PP is assumed to be the same as the weight % propylene in the iPP block as described previously.

$$\text{wt \% C3}_{Overall} = w_{PP\ isolated}(\text{wt \% C3}_{PP}) + w_{PE-fraction}(\text{wt \% C3}_{PE-fraction}) \quad \text{Eq. 3}$$

$$\text{wt \% C3}_{PE-fraction} = \frac{\text{wt \% C3}_{Overall} - w_{PPisolated}(\text{wt \% C3}_{PP})}{w_{PE-fraction}} \quad \text{Eq. 4}$$

$$w_{PE-fraction} = 1 - w_{PPisolated} \quad \text{Eq. 5}$$

where
$w_{PPisolated}$=weight fraction of isolated PP from HTLC
$w_{PE-fraction}$=weight fraction of PE separated from HTLC, containing the diblock and unbound PE
wt % $C3_{PP}$=weight % of propylene in the PP; which is also the same amount of propylene present in the PP block and in the unbound PP Wt % C3$_{PE\text{-}fraction}$=weight % of propylene in the PE-fraction that was separated by HTLC wt % C3$_{Overall}$=overall weight % propylene in the whole polymer The amount of wt % C3 in the polyethylene fraction from HTLC represents the amount of propylene present in the block copolymer fraction that is above the amount present in the 'unbound polyethylene'.

To account for the 'additional' propylene present in the polyethylene fraction, the only way to have PP present in this fraction, is that the PP polymer chain must be connected to a PE polymer chain (or else it would have been isolated with the PP fraction separated by HTLC). Thus, the PP block remains adsorbed with the PE block until the PE fraction is separated. The amount of PP present in the diblock is calculated using Equation 6.

$$w_{PP\text{-}diblock} = \frac{\text{wt \% } C3_{PE\text{-}fraction} - \text{wt \% } C3_{PE}}{\text{wt \% } C3_{PP} - \text{wt \% } C3_{PE}} \quad \text{Eq. 6}$$

Where wt % C3$_{PE\text{-}fraction}$=weight % of propylene in the PE-fraction that was separated by HTLC (Equation 4)

wt % C3$_{PP}$=weight % of propylene in the PP component or block (defined previously)

wt % C3$_{PE}$=weight % of propylene in the PE component or block (defined previously)

$w_{PP\text{-}diblock}$=weight fraction of PP in the diblock separated with PE-fraction by HTLC The amount of the diblock present in this PE fraction can be estimated by assuming that the ratio of the PP block to PE block is the same as the overall ratio of PP to PE present in the whole polymer. For example, if the overall ratio of PP to PE is 1:1 in the whole polymer, then it assumed that the ratio of PP to PE in the diblock is also 1:1. Thus the weight fraction of diblock present in the PE fraction would be weight fraction of PP in the diblock ($w_{PP\text{-}diblock}$) multiplied by two. Another way to calculate this is by dividing the weight fraction of PP in the diblock ($w_{PP\text{-}diblock}$) by the weight fraction of PP in the whole polymer (equation 2).

To further estimate the amount of diblock present in the whole polymer, the estimated amount of diblock in the PE fraction is multiplied by the weight fraction of the PE fraction measured from HTLC.

To estimate the crystalline block composite index, the amount of block copolymer is determined by equation 7. To estimate the CBCI, the weight fraction of diblock in the PE fraction calculated using equation 6 is divided by the overall weight fraction of PP (as calculated in equation 2) and then multiplied by the weight fraction of the PE fraction. The value of the CBCI can range from 0 to 1, wherein 1 would be equal to 100% diblock and zero would be for a material such as a traditional blend or random copolymer.

$$CBCI = \frac{w_{PP\text{-}diclock}}{w_{PP}} \cdot w_{PE\text{-}fraction} \quad \text{Eq. 7}$$

Where $w_{PP\text{-}diblock}$=weight fraction of PP in the diblock separated with the PE-fraction by HTLC (Equation 6)

$w_{PP}$=weight fraction of PP in the polymer $w_{PE\text{-}fraction}$=weight fraction of PE separated from HTLC, containing the diblock and unbound PE (Equation 5)

For example, if an iPP-PE polymer contains a total of 62.5 wt % C3 and is made under the conditions to produce an PE polymer with 10 wt % C3 and an iPP polymer containing 97.5 wt % C3, the weight fractions of PE and PP are 0.400 and 0.600, respectively (as calculated using Equation 2). Since the percent of PE is 40.0 wt % and the iPP is 60.0 wt %, the relative ratio of the PE:PP blocks is expressed as 1:1.5.

Hence, if one skilled in the art, carries out an HTLC separation of the polymer and isolates 28 wt % PP and 72 wt % of the PE fraction, this would be an unexpected result and this would lead to the conclusion that a fraction of block copolymer was present. If the C3 content of the PE fraction (Wt % C$_{3PE\text{-}fraction}$) is subsequently calculated to be 48.9 wt % C3 from equations 4 and 5, the PE fraction containing the additional propylene has 0.556 wt fraction of PE polymer and 0.444 weight fraction of PP polymer ($w_{PP\text{-}diblock}$, calculated using Equation 6).

Since the PE fraction contains 0.444 weight fraction of PP, it should be attached to an additional 0.293 weight fraction of PE polymer based on the iPP:PE block ratio of 1.5:1. Thus, the weight fraction of diblock present in the PE fraction is 0.741; further calculation of the weight fraction of diblock present in the whole polymer is 0.533. For the entire polymer, the composition is described as 53.3 wt % iPP-PE diblock, 28 wt % PP polymer, and 18.7 wt % PE polymer. The crystalline block composite index (CBCI) is the estimated weight fraction of diblock present in the whole polymer. For the example described above, the CBCI for the crystalline block composite is 0.533.

The Crystalline Block Composite Index (CBCI) provides an estimate of the quantity of block copolymer within the crystalline block composite under the assumption that the ratio of CEB to CAOB within the diblock is the same as the ratio of crystalline ethylene to crystalline alpha-olefin in the overall crystalline block composite. This assumption is valid for these statistical olefin block copolymers based on the understanding of the individual catalyst kinetics and the polymerization mechanism for the formation of the diblocks via chain shuttling catalysis as described in the specification.

The calculation of CBCI is based on the analytical observation that the amount of free CAOP is lower than the total amount of CAOP that was produced in the polymerization. The remainder of the CAOP is bound to CEB to form the diblock copolymer. Because the PE fraction separated by HTLC contains both the CEP and the diblock polymer, the observed amount of propylene for this fraction is above that of the CEP. This difference can be used to calculate the CBCI.

Based solely on the analytical observations without prior knowledge of the polymerization statistics, the minimum and maximum quantities of block copolymer present in a polymer can be calculated, thus distinguishing a crystalline block composite from a simple copolymer or copolymer blend.

The upper bound on the amount of block copolymer present within a crystalline block composite, $w_{DB_{Max}}$, is obtained by subtracting the fraction of unbound PP measured by HTLC from one as in Equation 8. This maximum assumes that the PE fraction from HTLC is entirely diblock and that all crystalline ethylene is bound to crystalline PP with no unbound PE. The only material in the CBC that is not diblock is that portion of PP separated via HTLC.

$$w_{DB_{Max}} = 1 - w_{PP_{isolated}} \quad \text{Eq. 8}$$

The lower bound on the amount of block copolymer present within a crystalline block composite, $w_{DB_{Min}}$, corresponds to the situation where little to no PE is bound to PP. This lower limit is obtained by subtracting the amount of unbound PP as measured by HTLC from the total amount of PP in the sample as shown in Equation 9.

$$w_{DB_{Min}} = w_{PP} - w_{PP_{isolated}} \qquad \text{Eq. 9}$$

Furthermore, the crystalline block composite index will fall between these two values:

$$w_{DB_{Min}} < CBCI \leq w_{DB_{Max}}.$$

Based on the polymerization mechanism for production of the crystalline block composites, the CBCI represents the best estimate of the actual fraction of diblock copolymer in the composite. For unknown polymer samples, $w_{DB_{Min}}$ can be used to determine if a material is a crystalline block composite. For a physical blend of PE and PP, the overall weight fraction of PP should be equal to that of the wt % PP from HTLC and the lower bound on diblock content, Equation 9, is zero. If this analysis is applied to a sample of PP that does not contain PE both the weight fraction of PP and amount of PP obtained from HTLC are 100% and again the lower bound on diblock content, Equation 9, is zero. Finally if this analysis is applied to a sample of PE that does not contain PP then both the weight fraction of PP and weight fraction PP recovered via HTLC are zero and the lower bound on diblock, Equation 9, is zero. Because the lower bound on diblock content is not greater than zero in any of these three cases, these materials are not crystalline block composites.

Differential Scanning Calorimetry (DSC)

Differential Scanning Calorimetry is used to measure, among other things, the heats of fusion of the crystalline block and block composites and is performed on a TA Instruments Q1000 DSC equipped with an RCS cooling accessory and an auto sampler. A nitrogen purge gas flow of 50 ml/min is used. The sample is pressed into a thin film and melted in the press at about 190° C. and then air-cooled to room temperature (25° C.). About 3-10 mg of material is then cut, accurately weighed, and placed in a light aluminum pan (ca 50 mg) which is later crimped shut. The thermal behavior of the sample is investigated with the following temperature profile: the sample is rapidly heated to 190° C. and held isothermal for 3 minutes in order to remove any previous thermal history. The sample is then cooled to -90° C. at 10° C./min cooling rate and held at -90° C. for 3 minutes. The sample is then heated to 190° C. at 10° C./min heating rate. The cooling and second heating curves are recorded. For the heat of fusion measurements for the CBC and specified BC resins, as known and routinely performed by skilled practitioners in this area, the baseline for the calculation is drawn from the flat initial section prior to the onset of melting (typically in the range of from about -10 to about 20° C. for these types of materials) and extends to the end of melting for the second heating curve.

To summarize:

Suitable block composite resins (BC's) comprise:
i) an ethylene polymer (EP) comprising from about 80 to about 90 mol % polymerized ethylene, preferably at least about 85 mol %;
ii) an alpha-olefin-based crystalline polymer (CAOP) and
iii) a block copolymer comprising (a) an ethylene polymer block (EB) comprising from about 10 to about 90 mol % ethylene and (b) a crystalline alpha-olefin block (CAOB).

Crystalline block composite resins (CBC's) comprise:
i) a crystalline ethylene polymer (CEP) comprising at least greater than about 90 mol % polymerized ethylene, preferably at least about 93 mol %;
ii) an alpha-olefin-based crystalline polymer (CAOP) and
iii) a block copolymer comprising (a) a crystalline ethylene polymer block (CEB) comprising at least greater than about 90 mol % polymerized ethylene, preferably at least about 93 mol % and (b) a crystalline alpha-olefin block (CAOB).

Another way to collectively summarize the suitable resin (s) used in Layer B is as comprising a CBC or a specified BC comprising:
i) an ethylene polymer comprising at least about 80 mol % polymerized ethylene, preferably at least about 85 mol %, more preferably at least about 90 mol %, and most preferably at least about 93 mol % polymerized ethylene;
ii) an alpha-olefin-based crystalline polymer (CAOP) and
iii) a block copolymer comprising (a) an ethylene polymer block comprising at least about 80 mol % polymerized ethylene, preferably at least about 85 mol %, more preferably at least about 90 mol %, and most preferably at least about 93 mol % polymerized ethylene and (b) a crystalline alpha-olefin block (CAOB).

Preferred suitable BC and/or CBC resin(s) for Layer B have a CAOB amount (in part (iii)) in the range of from about 30 to about 70 weight % (based on (iii)), preferably at least about 40 wt %, more preferably at least about 45 wt % and most preferably about 50 wt %, and preferably up to about 60 wt %, and preferably up to about 55 wt % (the balance in each case being ethylene polymer). It has also been found that the BC and/or CBC resin(s) suitable for Layer B have a (crystalline) block composite index of at least about 0.1, preferably at least about 0.3, preferably at least about 0.5 and more preferably at least about 0.7. Another way to characterize the suitable BC and/or CBC resin(s) essential for Layer B is as having a MFR in the range of from about 1 to about 50 dg/min; preferably at least about 2, more preferably at least about 3; and preferably up to about 40, and preferably up to about 30 g/min.

In general, BC's that can be used in Layer B according to the present invention will have heat of fusion values (generally related to their ethylene content in the EP and EB) of at least about 75 Joules per gram (J/g), more preferably at least about 80 J/g, still more preferably at least about 85 J/g and most preferably at least about 90 J/g, as measured by DSC. In general, CBC's that can be used in Layer B according to the present invention will have heat of fusion values (reflecting the relatively higher ethylene content in the CEP and CEB) as measured by DSC of at least about 85 Joules per gram (J/g), more preferably at least about 90 J/g. In either case, the heat of fusion values for polymers of these types would generally have a maximum in the area of about 125 J/g. For the heat of fusion measurements, as generally known and performed by practitioners in this area, the DSC is run as generally described below under nitrogen at 10° C./min from 23° C. to 220° C., held isothermal at 220° C., dropped to 23° C. at 10° C./min and ramped back to 220° C. at 10° C./min. The second heat data is used to calculate the heat of fusion of the melting transition.

Blends of these resins can also be used in Layer B where blended or diluted with one or more other polymers, including the polyolefins as described herein. Suitable additional components could be, for example, LDPE, LLDPE, an impact modifier such as ethylene octene copolymer plastomers such as AFFINITY PL 1880G, PL8100G, and PL 1850G or ethylene octene copolymer elastomers such as ENGAGE 8842, ENGAGE 8150, and ENGAGE XLT 8677, or olefin block copolymers such as for example INFUSE 9100 and 9107 brand polymer or propylene based elastomers such as VERSIFY 2300 and VERSIFY 3300 brand resins available from The Dow Chemical Company. In alternative embodiments, the CBC and/or BC polymer resins of Layer B can be blended with other polyolefin resins that are grafted or functionalized with glycidyl methacrylate, maleic anhydride (MAH), amines or silane or they can be blended with polar copolymers of ethylene such as EEA, EVA, EMA, EnBA, EAA and the like. If used, the additional blend polymer needs to be: (i) miscible or highly compatible with the BC and/or CBC, (ii) have little, if any, deleterious impact on the desirable properties of the polyolefin block copolymer composite, e.g., toughness and modulus, and (iii) used in levels such that the BC and/or CBC resin(s) constitute from at least 40 to 99 weight percent of the blend, preferably at least 60, more preferably at least 75, and more preferably at least 80 weight percent of the blend. If used, blend components would be used in the Layer B resins in amounts of at least 2 weight percent, preferably at least 5 and more preferably at least 8 weight percent and preferably less than 30 weight percent, preferably less than 25 weight percent and more preferably less than 20 weight percent. Blending can be used to provide: improve compatibility (adhesion) with C and/or other layers under a range of conditions and lower costs. In particular, blends would desirably be employed where Layer B is employed as surface layer, as discussed below, and this film surface needs properties sufficient for roll-up, handling, packaging, transport and assembly into final laminate structures, such as into electronic device modules.

In an alternative embodiment of the present invention, all or part of the BC and/or CBC component in the Layer B are grafted or functionalized with glycidyl methacrylate, maleic anhydride (MAH), amines or silane to provide desired property modifications such as improved adhesion to other films or the surfaces of articles. In general, functionalization or grafting can be done by techniques known to those skilled in this art area. Particularly useful and applicable techniques are taught in copending United States patent applications filed Dec. 14, 2011: (a) Ser. No. 61/570,464 entitled, "FUNCTIONALIZED BLOCK COMPOSITE AND CRYSTALLINE BLOCK COMPOSITE COMPOSITIONS AS COMPATIBILIZERS and (b) Ser. No. 61/570,340 entitled, "FUNCTIONALIZED BLOCK COMPOSITE AND CRYSTALLINE BLOCK COMPOSITE COMPOSITIONS", which are incorporated herein by reference.

In an alternative embodiment of the present invention, with proper selection of the Layer B formulation, Layer B can be designed to have sufficient physical properties and be sufficiently adhesive to other films or articles and the films according to the present invention are two layer structures. Such other films to which adhesion may be desired include, for example, the "encapsulation films" employed in the assembly of electronic devices and discussed in more detail below, eliminating the need to have a further, separate seal layer. Such other articles to which Layer B adhesion may be desired include, for example, the surfaces of photovoltaic cells (eliminating the need to have further seal or encapsulation layers) or metal surfaces such as tin or other metals used in photovoltaic cells, and aluminum or other metals that might be employed in construction of lithium ion batteries. To provide the proper balance of adhesion and other properties in Layer B, the CBC and/or BC resin formulation employed would comprise: greater than 20 wt % CBC and/or BC resin, preferably greater than 40 wt % CBC and/or BC and more preferably greater than 50 wt % CBC and/or BC and even more preferably greater than 60 wt % CBC and/or BC. In this embodiment, the thickness of the Layer B would generally be greater than when used as tie layer with layers A and C in a 3 or more layer film.

Layer A Polyolefin Resin Components

Layer A, optionally employed according to the present invention and often referred to as a "seal" layer, is selected to be adhered, either preferably by co-extrusion or alternatively but less preferably by a lamination process (such as extrusion lamination, thermal lamination, or adhesive lamination) to the tie layer (Layer B) in production of the film according to the invention and to adhere the film to other films or articles such as the encapsulation films employed in the assembly of electronic devices ("encapsulation films" being discussed in more detail below). Layer A materials can be selected from a very wide variety of different types of materials assembled in blends and/or layers as described in more detail below. Among other things, the relative thinness of Layer A distinguishes it from a layer that would serve as an "encapsulation" layer.

The wide variety of candidate seal layer materials includes generally wide range of thermoplastic ethylene-based polymers, such as high pressure, free-radical low density polyethylene (LDPE), and ethylene-based polymers prepared with Ziegler-Natta catalysts, including high density polyethylene (HDPE) and heterogeneous linear low density polyethylene (LLDPE), ultra low density polyethylene (ULDPE), and very low density polyethylene (VLDPE), as well as multiple-reactor ethylenic polymers ("in reactor" blends of Ziegler-Natta PE and metallocene PE, such as products disclosed in U.S. Pat. No. 6,545,088 (Kolthammer et al.); U.S. Pat. No. 6,538,070 (Cardwell et al.); U.S. Pat. No. 6,566,446 (Parikh et al.); U.S. Pat. No. 5,844,045 (Kolthammer et al.); U.S. Pat. No. 5,869,575 (Kolthammer et al.); and U.S. Pat. No. 6,448,341 (Kolthammer et al.)). Commercial examples of linear ethylene-based polymers include ATTANE™ Ultra Low Density Linear Polyethylene Copolymer, DOWLEX™ Polyethylene Resins, and FLEXOMER™ Very Low Density Polyethylene, ELITE™ brand enhanced polyethylene resin, all available from The Dow Chemical Company. Other suitable synthetic polymers include ethylene/diene interpolymers, ethylene acrylic acid (EAA), ethylene-vinyl acetate (EVA), ethylene ethyl acrylate (EEA), ethylene methyl acrylate (EMA), ethylene n-butyl acrylate (EnBA), ethylene methacrylic acid (EMAA), various types of ionomers, and ethylene/vinyl alcohol copolymers. Homogeneous olefin-based polymers such as ethylene-based plastomers or elastomers can also be useful as components in blends or compounds made with the ethylenic polymers of this invention. Commercial examples of homogeneous metallocene-catalyzed, ethylene-based plastomers or elastomers include AFFINITY™ polyolefin plastomers and ENGAGE™ polyolefin elastomers, both available from The Dow Chemical Company, and commercial examples of homogeneous propylene-based plastomers and elastomers include VERSIFY™ performance polymers, available from The Dow Chemical Company, and VISTAMAX™ polymers available from ExxonMobil Chemical Company. Suitable ethylene-propylene polymers include BC's and CBC's as described above.

Layer A Olefinic Interpolymers

Some specific preferred examples of olefinic interpolymers useful in this invention, particularly in the top layer of the backsheet, include very low density polyethylene (VLDPE) (e.g., FLEXOMER® ethylene/1-hexene polyethylene made by The Dow Chemical Company), homogeneously branched, linear ethylene/α-olefin copolymers (e.g. TAFMER® by Mitsui Petrochemicals Company Limited and EXACT® by Exxon Chemical Company), homogeneously branched, substantially linear ethylene/α-olefin polymers (e.g., AFFINITY® and ENGAGE® polyethylene available from The Dow Chemical Company), and ethylene multi-block copolymers (e.g., INFUSE® olefin block copolymers available from The Dow Chemical Company). The more preferred polyolefin copolymers for use in the top layer of the backsheet are the homogeneously branched linear and substantially linear ethylene copolymers, particularly the substantially linear ethylene copolymers which are more fully described in U.S. Pat. Nos. 5,272,236, 5,278,272 and 5,986,028, and the ethylene multi-block copolymers which are more fully described in U.S. Pat. No. 7,355,089, WO 2005/090427, US2006/0199931, US2006/0199930, US2006/0199914, US2006/0199912, US2006/0199911, US2006/0199910, US2006/0199908, US2006/0199906, US2006/0199905, US2006/0199897, US2006/0199896, US2006/0199887, US2006/0199884, US2006/0199872, US2006/0199744, US2006/0199030, US2006/0199006 and US2006/0199983.

Layer A Polar Ethylene-Copolymers

One preferred polar ethylene copolymer for use in the top layer of the claimed films is an EVA copolymer, including blends comprising EVA copolymers, that will form a sealing relationship with other films or layers, e.g., encapsulant, a glass cover sheet, etc. when brought into adhesive contact with the layer or other component. The ratio of units derived from ethylene to units derived from vinyl acetate in the copolymer, before grafting or other modification, can vary widely, but typically the EVA copolymer contains at least about 1, preferably at least 2, more preferably at least 4 and even more preferably at least 6, wt % units derived from vinyl acetate. Typically, the EVA copolymer contains less than about 33 wt % units derived from vinyl acetate, preferably less than 30, preferably less than 25, preferably less than 22, preferably less than 18 and more preferably less than 15 wt % units derived from vinyl acetate. The EVA copolymer can be made by any process including emulsion, solution and high-pressure polymerization.

The EVA copolymer before grafting or other modification typically has a density of less than 0.95, preferably less than 0.945, more preferably less than 0.94, g/cc. The same EVA copolymer typically has a density greater than 0.9, preferably greater than 0.92, and more preferably greater than 0.925, g/cc. Density is measured by the procedure of ASTM D-792. EVA copolymers are generally characterized as semi-crystalline, flexible and having good optical properties, e.g., high transmission of visible and UV-light and low haze.

Another preferred polar ethylene copolymer useful as top layer of the backsheet is an ethylene acrylate copolymer such as ethylene ethyl acrylate (EEA) and ethylene methyl acrylate (EMA) copolymers, (including blends comprising either) that can also form a sealing relationship with the adjacent layer, such as an encapsulant layer in an electronic device module, when they are brought into adhesive contact. The ratio of units derived from ethylene to units derived from ethyl acrylate or methyl acrylate in the copolymer, before grafting or other modification, can vary widely, but typically the EEA or EMA copolymer contains at least 1, preferably at least 2, more preferably at least 4 and even more preferably at least 6, wt % units derived from the ethyl acrylate or methyl acrylate. Typically, the EEA or EMA copolymer contains less than 28, preferably less than 25, more preferably less than 22, and more preferably less than 19, wt % units derived from ethyl acrylate or methyl acrylateacrylate.

These polar ethylene copolymers (e.g., EVA, EEA or EMA copolymers) typically have a melt index (MI as measured by the procedure of ASTM D-1238 (190 C/2.16 kg) of less than 100, preferably less than 75, more preferably less than 50 and even more preferably less than 30, g/10 min. The typical minimum MI is at least 0.3, more preferably 0.7, and more preferably it is at least 1 g/10 min.

One preferred top layer of the backsheet is a blend formulation of a linear low density polyethylene (LLDPE) comprising polar ethylene copolymer in an amount of from 10 to 45 weight %, the weight % depending upon the polar ethylene copolymer being used.

Layer A MAH-m-Polyolefins

MAH-m-polyolefins are another preferred seal layer material and include MAH-g-polyolefins and MAH interpolymers, i.e., the MAH functionality is present in the polyolefin either by grafting onto the polymer backbone or incorporating the functionality into the backbone through copolymerization of MAH with the olefin monomer.

In one embodiment of the invention, the polyolefin is graft-modified to enhance the interlayer adhesion between the top layer and the bottom layer of the multilayer structure through a reaction of the grafted functionality with the reactive group present in the middle tie layer. Any material that can be grafted to the polyolefin and can react with the reactive group present in the tie layer can be used as the graft material.

Any unsaturated organic compound containing at least one ethylenic unsaturation (e.g., at least one double bond), at least one carbonyl group (—C═O), and that will graft to the polyolefin polymer and more particularly to EVA, EEA, EMA or polypropylene, can be used as the grafting material. Representative of compounds that contain at least one carbonyl group are the carboxylic acids, anhydrides, esters and their salts, both metallic and nonmetallic. Preferably, the organic compound contains ethylenic unsaturation conjugated with a carbonyl group. Representative compounds include maleic, fumaric, acrylic, methacrylic, itaconic, crotonic, α-methyl crotonic, and cinnamic acid and their anhydride, ester and salt derivatives, if any. Maleic anhydride is the preferred unsaturated organic compound containing at least one ethylenic unsaturation and at least one carbonyl group.

The unsaturated organic compound content of the graft polyolefin is at least 0.01 wt %, and preferably at least 0.05 wt %, based on the combined weight of the polyolefin and the organic compound. The maximum amount of unsaturated organic compound content can vary to convenience, but typically it does not exceed 10 wt %, preferably it does not exceed 5 wt %, and more preferably it does not exceed 2 wt %. This unsaturated organic content of the graft polyolefin is measured by a titration method, e.g., a grafted polyolefin/xylene solution is titrated with a potassium hydroxide (KOH) solution. The MAH functionality can be present in the polyolefin e.g., by grafting, or even by copolymerization with the olefin monomer.

The unsaturated organic compound can be grafted to the polyolefin by any known technique, such as those taught in U.S. Pat. Nos. 3,236,917 and 5,194,509. For example, in the '917 patent the polymer is introduced into a two-roll mixer and mixed at a temperature of 60° C. The unsaturated organic compound is then added along with a free radical initiator, such as, for example, benzoyl peroxide, and the components are mixed at 30° C. until the grafting is completed. In the '509 patent, the procedure is similar except that the reaction temperature is higher, e.g., 210 to 300° C., and a free radical initiator is not used or is used at a reduced concentration.

An alternative and preferred method of grafting is taught in U.S. Pat. No. 4,950,541 by using a twin-screw devolatilizing extruder as the mixing apparatus. The polymer and unsaturated organic compound are mixed and reacted within the extruder at temperatures at which the reactants are molten and in the presence of a free radical initiator. Preferably, the unsaturated organic compound is injected into a zone maintained under pressure within the extruder.

Layer A Silane Grafted Ethylene-Based Polymers

In another preferred embodiment, a suitable material for Layer A can be provided by a silane grafted polyolefin as described below for use as the encapsulation layer, particularly as provided by silane grafting in the thermoplastic ethylene-based polymers described above, including in an olefinic interpolymer or polar ethylene copolymer described above. If used as Layer A in a backsheet film according to the present invention, as discussed below, the silane grafted polyolefin layer thickness would generally be less than 200 micron (μm), and more preferably less than 100 μm and not sufficient to serve as a typical encapsulation layer that is commonly a film 450 μm thick. It will, however, in layer A of the present films provide good sealing with such materials used in encapsulation films.

Layer A Crystalline Olefin Block Composite

In another preferred embodiment of the present invention and depending upon the nature of the encapsulant film layer, a suitable sealing layer can be provided by a crystalline block copolymer composite as described above. In a backsheet according to the present invention, depending upon the specific selection of this type of crystalline block copolymer composite as the B layer, the B layer can serve as both Layers B and A. In a preferred embodiment, the present invention is a novel film comprising Layers B and C. In this embodiment, it may also be desirable to incorporate a minor amount (e.g., less than 25%) of a polar ethylene copolymer in such crystalline block copolymer composite.

Blends

Blends comprising these polyolefin resins with others as described above can also be used in Layer A of films according to the invention. In other words, Layer A polyolefin polymers can be blended or diluted with one or more other polymers to the extent that the polyolefin is (i) compatible with the other polymer, (ii) the other polymer has little, if any, deleterious impact on the desirable properties of the polyolefin polymer, e.g., toughness and modulus, and (iii) the polyolefin polymer of this invention constitutes at least 55, preferably at least 70, preferably at least 75 and more preferably at least 80, weight percent of the blend.

Crosslinking in Layer A

Although crosslinking would preferably be avoided, due to the low density and modulus of the polyolefin resins used in the practice of this invention, these polymers can be cured or crosslinked at the time of lamination or after, usually shortly after, assembly of the layers into the multilayered article, e.g., PV module. Crosslinking can be initiated and performed by any one of a number of different and known methods, e.g., by the use of thermally activated initiators, e.g., peroxides and azo compounds; photoinitiators, e.g., benzophenone; radiation techniques including Electron-beam and x-ray; vinyl silane, e.g., vinyl tri-ethoxy or vinyl tri-methoxy silane; and moisture cure.

Additives in Layers A, B, or C

The individual layers of the multilayered structure can further comprise one or more additives. Exemplary stabilizer additives include UV-stabilizers, UV-absorbers, and antioxidants. These stabilizer additives are useful in, e.g., reducing the oxidative degradation and improving the weatherability of the product. Suitable stabilizers include hindered amines and hindered benzoates such as Cynergy A400, A430, R350 and R350-a4, Cyasorb UV-3529, Cyasorb UV-3346, Cyasorb UV-3583, Hostavin N30, Univil 4050, Univin 5050, Chimassorb UV-119, Chimassorb 944 LD, Tinuvin 622 LD and the like; UV absorbers such as Tinuvin 328 or Cyasorb UV-1164 and the like and; primary and secondary antioxidants such as Cyanox 2777, Irganox 245, 1010, 1076, B215, B225, PEPQ, Weston 399, TNPP, Irgafos 168 and Doverphos 9228. The amounts and combinations of stabilizers needed depend on the type, aging environment and longevity desired and are used in the manner and, as is commonly known in the art, the amounts typically range between greater than 0.01 and less than 3% weight percent based on the polymer weight being stabilized.

Other additives that can be used include, but are not limited to ignition resistance additives, anti-blocks such as diatomaceous earth, superfloss, silicates, talc, mica, wolastonite, and epoxy coated talcs, and the like; slip additives such as erucamide and stearamide and the like, polymer process aids such as Dyneon fluropolymer elastomers like Dynamar FX5930, pigments and fillers such as $TiO_2$ R960, R350, R105, R108, R104, graphites, carbon blacks such as used in Dow DNFA-0037 masterbatch or provided by Cabot. Also, pigments commonly used to create colored plastics may be employed, especially those known to have greater light stability. These and other potential additives are used in the manner and amount as is commonly known in the art.

Multilayer Film Structures and ED Modules

In describing the use of the polymer components above to make laminate or layered structures, there are a number of terms that are regularly used and defined as follows.

"Layer" means a single thickness, coating or stratum continuously or discontinuously spread out or covering a surface.

"Multi-layer" means at least two layers.

"Facial surface", "planar surface" and like terms as related to films or layers mean the surfaces of the layers that are in contact with the opposite and adjacent surfaces of the adjoining layers. Facial surfaces are in distinction to edge surfaces. A rectangular film or layer comprises two facial surfaces and four edge surfaces. A circular layer comprises two facial surfaces and one continuous edge surface.

"In adhering contact" and like terms mean that one facial surface of one layer and one facial surface of another layer are in touching and binding contact to one another such that one layer cannot be removed for the other layer without damage to the in-contact facial surfaces of both layers.

"Sealing relationship" and like terms mean that two or more components, e.g., two polymer layers, or a polymer layer and an electronic device, or a polymer layer and a glass cover sheet, etc., join with one another in such a manner, e.g., co-extrusion, lamination, coating, etc., that the interface formed by their joining is separated from their immediate external environment.

The polymeric materials as discussed above can be used in this invention to construct multilayer structure film or sheet, which is used in turn to construct and electronic device modules in the same manner and using the same amounts as is known in the art, e.g., such as those taught in U.S. Pat. No. 6,586,271, US Patent Application Publication US2001/0045229 A1, WO 99/05206 and WO 99/04971. These materials can be used to construct "skins" for the electronic device, i.e., multilayered structures for application to one or both face surfaces of the device, particularly the back surface of such devices, i.e., "backsheets". Preferably these multilayered structures, e.g., backsheets, are co-extruded, i.e., all layers of the multilayered structures are extruded at the same time, such that as the multilayered structure is formed.

Depending upon their intended use, the multilayer film or sheet structures according to the present invention can be designed to meet certain performance requirements such as in the areas of physical performance properties including toughness, transparency, tensile strength, interlayer adhesion, and heat resistance; electrical properties such as insulation, dielectric breakdown, partial discharge and resistance; reflectance; and appearance.

Layer C—Comprising High Melting Point Polyolefin Resins

In general, Layer C in the multilayer backsheet structures according to the present invention is prepared from the "Layer C High Melting Point Polyolefin Resins" as discussed above. In one preferred embodiment, it is preferably a highly crystalline homopolymer polypropylene resin. Depending upon the specific performance requirements for the film and/or a module structure in which it is intended for use, the thickness of Layer C is typically in the range of from 100 μm to 400 μm. As for minimum thickness, Layer C is preferably at least 125 μm, more preferably at least 150 μm, more preferably at least 160 μm and most preferably at least 170 μm thick. As for maximum thickness, the thickness of Layer C can be up to and including 375 μm; 350 μm, preferably 300 μm, more preferably 275 μm and most preferably 250 μm.

Layer B—Comprising Polyolefin Block Copolymer Composite Resin

In general, Layer B in the multilayer backsheet film structures according to the several embodiments of the present invention is prepared from the "Layer B Polyolefin Block Composite Resins" as discussed above. In one preferred embodiment, it is preferably a crystalline block copolymer composite resin. Depending upon the specific performance requirements for the film and/or a module structure in which it is intended for use, the thickness of Layer B is typically in the range of from 1 μm to 500 μm. In the alternative embodiment of the present invention where Layer B is sufficiently strong and adhesive and the films according to the present invention are two layer structures of Layers B and C for use in the electronic device embodiment, the thickness of the Layer B would generally be at least 10 um, more preferably at least 15 um, even more preferably at least 25 um and preferably less than or equal to 500 um, more preferably less than or equal to 400 um and even more preferably less than or equal to 350 um. With Layer B serving as both a surface seal layer it is preferably a blend comprising the CBC and one or more other components such as polymer process aids, colorants, and slip or antiblock additives. As for minimum thickness when used as tie layer with at least an A and C layer, Layer B is only as thick as needed to tie the adjacent Layers A and C together and can preferably be at least 2 μm, preferably at least 3 μm, preferably at least 4 μm, more preferably at least 10 μm, more preferably at least 15 μm, more preferably at least 20 μm and most preferably at least 25 μm thick. As for maximum thickness when a tie layer for A and C, the thickness and cost of Layer B are desirably minimized but are preferably up to and including 150 μm, preferably 100 μm, more preferably 75 μm and most preferably up to and including 50 μm thick.

Layer A—Seal Layer

As mentioned above, in one multilayered article embodiment of the present invention, the top or seal Layer A adheres the films according to the present invention to an encapsulating film. Depending upon the specific performance requirements for the film and/or a module structure in which it is intended for use, the thickness of Layer A is typically in the range of from 15 μm to 200 μm. As for minimum thickness, Layer A is only as thick as needed to adhere the backsheet to the encapsulation film layer and should be at least 17 μm, preferably at least 20 μm, more preferably at least 23 μm and most preferably at least 25 μm thick. As for maximum thickness, the thickness and cost of Layer A are desirably minimized but can be up to and including 175 μm, preferably 150 μm, more preferably 130 μm, and most preferably up to and including 125 μm.

Film Structure and Thickness

The composition of the layers can be selected and optimized along the lines discussed herein depending upon the intended film structure and usage of the film structure. For example, for use in electronic device laminate structures multilayer films according the present invention, the films can be employed as a 2 layer backsheet or a 3 layer backsheet (comprising both a tie layer and a top seal layer). The films according to the present invention are suitable to be employed as, among other things, backsheet layers for direct use in laminate electronic device structures, such as, for example PV modules.

In all cases, the top facial surface of the multilayered film structure exhibits good adhesion for the facial surfaces of the encapsulation layer material that encapsulates the device.

Depending somewhat upon the specific structure and process for utilizing the film or sheet that structures according to the present invention, such film structures can be prepared by any of a large number of known film production processes including but not limited to extrusion or co-extrusion methods such as blown-film, modified blown-film, calendaring and casting, as well as sheet extrusion using a roll stack. There are many known techniques which can be employed for providing multilayer films (up to and including microlayer films), including for example in U.S. Pat. Nos. 5,094,788; 5,094,793; WO/2010/096608; WO 2008/008875; U.S. Pat. Nos. 3,565,985; 3,557,265; 3,884,606; 4,842,791 and 6,685,872 all of which are hereby incorporated by reference herein. Layers A, B and C of the films according to the present invention, are selected to be adhered simultaneously together preferably by co-extrusion or alternatively but less preferably by a lamination process (such as extrusion lamination, thermal lamination, or adhesive lamination) into the films according to the invention. Alternatively but less preferably, a sequential process can be employed to adhere pairs of layers together and to the third and any optional layers.

The overall thickness of the multilayered films and, in particular backsheet structures, according to the present invention, prior to attachment to other layers such as encapsulant layers, electronic devices and/or anything else, is typically between 50 μm and 825 μm. Preferably to provide sufficient physical properties and performance, the film thickness is at least 75 μm, and more preferably at least 125 μm. To maintain light weight and low costs, but retain the requisite electrical properties, the film thickness is preferably 775 μm or less, more preferably 575 μm or less. This includes any optional, additional layers that form and are an integral part of the multilayer structure comprising layers A, B and C.

FIG. 1, not to scale, is a cross-sectional view of an electronic device comprising a three-layer backsheet 14 comprising "A" Layer 14A, "B" Layer 14B and "C" Layer 14C all in adhering contact with each other, further in adhering contact with an encapsulant layer 12b adhered or laminated to the back surface of an electronic device, e.g., a PV cell.

PV Module Structures and Terms

"Photovoltaic cells" ("PV cells") contain one or more photovoltaic effect materials of any of several inorganic or organic types which are known in the art and from prior art photovoltaic module teachings. For example, commonly used photovoltaic effect materials include one or more of the known photovoltaic effect materials including but not limited to crystalline silicon, polycrystalline silicon, amorphous silicon, copper indium gallium (di)selenide (CIGS), copper indium selenide (CIS), cadmium telluride, gallium arsenide, dye-sensitized materials, and organic solar cell materials.

As shown by the diagram of a PV module in FIG. 1, PV cells (11) are typically employed in a laminate structure and have at least one light-reactive surface that converts the incident light into electric current. Photovoltaic cells are well known to practitioners in this field and are generally packaged into photovoltaic modules that protect the cell(s) and permit their usage in their various application environments, typically in outdoor applications. As used herein, PV cells may be flexible or rigid in nature and include the photovoltaic effect materials and any protective coating surface materials that are applied in their production as well as appropriate wiring and electronic driving circuitry (not shown).

"Photovoltaic modules" ("PV Modules"), such as represented by the example structure shown in FIG. 1, contain at least one photovoltaic cell 11 (in this case having a single light-reactive or effective surface directed or facing upward in the direction of the top of the page) surrounded or encapsulated by a light transmitting protective encapsulating sub-component 12a on the top or front surface and protective encapsulating sub-component 12b on the rear or back surface, which is optionally light transmitting. Combined, 12a and 12b form an encapsulating component 12, shown here as a combination of two encapsulating layers "sandwiching" the cell. The light transmitting cover sheet 13 has an interior surface in adhering contact with a front facial surface of the encapsulating film layer 12a, which layer 12a is, in turn, disposed over and in adhering contact with PV cell 11.

Multilayer backsheet films 14 according to the present invention act as a substrate and supports a rear surface of the PV cell 11 and optional encapsulating film layer 12b, which, in this case is disposed on a rear surface of PV cell 11. Back sheet layer 14 (and even encapsulating sub-layer 12b) need not be light transmitting if the surface of the PV cell to which it is opposed is not effective, i.e., reactive to sunlight. In the case of a flexible PV module, as the description "flexible" implies, it would comprise a flexible thin film photovoltaic cell 11.

In the electronic device (and especially the PV module) embodiments of the present invention, the top layer or coversheet 13 and the top encapsulating layer 12a generally need to have good, typically excellent, transparency, meaning transmission rates in excess of 90, preferably in excess of 95 and even more preferably in excess of 97, percent as measured by UV-vis spectroscopy (measuring absorbance in the wavelength range of 250-1200 nanometers. An alternative measure of transparency is the internal haze method of ASTM D-1003-00. If transparency is not a requirement for operation of the electronic device, then the polymeric material can contain opaque filler and/or pigment.

The thicknesses of all the electronic device module layers, described further below, both in an absolute context and relative to one another, are not critical to this invention and as such, can vary widely depending upon the overall design and purpose of the module. Typical thicknesses for protective or encapsulate layers 12a and 12b are in the range of 0.125 to 2 millimeters (mm), and for the cover sheet in the range of 0.125 to 1.25 mm. The thickness of the electronic device can also vary widely.

Light transmitting Encapsulation Component or Layer

These layers are sometimes referred to in various types of PV module structures as "encapsulation" films or layers or "protective" films or layers or "adhesive" films or layers. So long as sufficiently light transmitting, these layers can employ the same resins and resin compositions as described above in connection with their use as Layer A for backsheet embodiments of the present invention. Typically, these layers function to encapsulate and protect the interior photovoltaic cell from moisture and other types of physical damage and adhere it to other layers, such as a glass or other top sheet material and/or a back sheet layer. Optical clarity, good physical and moisture resistance properties, moldability and low cost are among the desirable qualities for such films. Suitable polymer compositions and films include those used and in the same manner and amounts as the light transmitting layers used in the known PV module laminate structures, e.g., such as those taught in U.S. Pat. No. 6,586,271, US Patent Application Publication US2001/0045229 A1, WO 99/05206 and WO 99/04971. These materials can be used as the light transmitting "skin" for the PV cell, i.e., applied to any faces or surfaces of the device that are light-reactive. Suitable films are known and commercially available including ENLIGHT™ brand polyolefin encapsulant films commercially available from The Dow Chemical Company.

Light Transmitting Cover Sheet

Light transmitting cover sheet layers, sometimes referred to in various types of PV module structures as "cover", "protective" and/or "top sheet" layers, can be one or more of the known rigid or flexible sheet materials. Alternatively to glass or in addition to glass, other known materials can be employed for one or more of the layers with which the lamination films according to the present invention are employed. Such materials include, for example, materials such as polycarbonate, acrylic polymers, a polyacrylate, a cyclic polyolefin such as ethylene norbornene, metallocene-catalyzed polystyrene, polyethylene terephthalate, polyethylene naphthalate, fluoropolymers such as ETFE (ethylene-tetrafluoroethlene), PVF (polyvinyl fluoride), FEP (fluoroethylene-propylene), ECTFE (ethylene-chlorotrifluoroethylene), PVDF (polyvinylidene fluoride), and many other types of plastic or polymeric materials, including laminates, mixtures or alloys of two or more of these materials. The location of particular layers and need for light transmission and/or other specific physical properties would determine the specific material selections. As needed and possible based upon their composition, the down conversion/light stabilizer formulations discussed above can be employed in the transparent cover sheets. However, the inherent stability of some of these may not require light stabilization according to the present invention.

When used in certain embodiments of the present invention, the "glass" used as a light transmitting cover sheet refers to a hard, brittle, light transmitting solid, such as that used for windows, many bottles, or eyewear, including, but not limited to, soda-lime glass, borosilicate glass, sugar glass, isinglass (Muscovy-glass), or aluminum oxynitride. In the technical sense, glass is an inorganic product of fusion which has been cooled to a rigid condition without crystallizing. Many glasses contain silica as their main component and glass former.

Pure silicon dioxide (SiO2) glass (the same chemical compound as quartz, or, in its polycrystalline form, sand) does not absorb UV light and is used for applications that require transparency in this region. Large natural single crystals of quartz are pure silicon dioxide, and upon crushing are used for high quality specialty glasses. Synthetic amorphous silica, an almost 100% pure form of quartz, is the raw material for the most expensive specialty glasses.

The glass layer of the laminated structure is typically one of, without limitation, window glass, plate glass, silicate glass, sheet glass, float glass, colored glass, specialty glass which may, for example, include ingredients to control solar heating, glass coated with sputtered metals such as silver, glass coated with antimony tin oxide and/or indium tin oxide, E-glass, and Solexia™ glass (available from PPG Industries of Pittsburgh, Pa.).

Laminated PV Module Structures

The methods of making PV modules known in the art can readily be adapted to use the multilayer backsheet film structures according to present invention. For example, the multilayer backsheet film structures according to present invention can be used in the PV modules and methods of making PV modules such as those taught in U.S. Pat. No. 6,586,271, US Patent Application Publication US2001/0045229 A1, WO 99/05206 and WO 99/04971.

In general, in the lamination process to construct a laminated PV module, at least the following layers are brought into facial contact:
- a light-receiving top sheet layer (e.g., a glass layer) having an "exterior" light-receiving facial surface and an "interior" facial surface;
- a front light transmitting thermoplastic polymer film having at least one layer of light transmitting thermoplastic polymers comprising the down conversion/light stabilizer formulations according to present invention, having one facial surface directed toward the glass and one directed toward the light-reactive surface of the PV cell and encapsulating the cell surface, provided that this layer can be optional in some module structures where the PV cell material may be directly deposited on the light receiving layer (e.g., glass);
- a PV cell;
- a second encapsulating film layer; and
- a back layer comprising glass or other back layer substrate.

With the layers or layer sub-assemblies assembled in desired locations the assembly process typically requires a lamination step with heating and compressing at conditions sufficient to create the needed adhesion between the layers and, if needed in some layers or materials, initiation of their crosslinking. If desired, the layers may be placed into a vacuum laminator for 10 to 20 minutes at lamination temperatures in order to achieve layer-to-layer adhesion and, if needed, crosslinking of the polymeric material of the encapsulation element. In general, at the lower end, the lamination temperatures need to be at least 130° C., preferably at least 140° C. and, at the upper end, less than or equal to 170° C., preferably less than or equal to 160° C.

The following examples further illustrate the invention. Unless otherwise indicated, all parts and percentages are by weight.

Experiments

Experimental multilayer sample films (layers indicated by letters, e.g., A, B, and C), as summarized below in the Tables below, are made using the thermoplastic resin materials summarized below in Tables 1 and 2. Where indicated, the Melt Flow Rates (MFR) are measured according to ASTM D1238 (230 C/2.16 kg) and reported in grams per 10 minutes (g/10 min) and Melt Index values (MI) are measured according to ASTM D1238 (190 C/2.16 kg) and reported in g/10 min. The density is measured according to ASTM D792 and given in grams per cubic centimeter (g/cc). The polypropylene polyolefins all have at least one melting peak greater than 125° C. and heat of fusion values greater than 60 J/g.

TABLE 1

Resins Used in Examples

| Resin | Product name | Resin Supplier | MFR/MI | Density ASTM D792 (g/cc) |
|---|---|---|---|---|
| PP 1 | H314-02Z PP | Dow | 2.0 MFR | 0.900 |
| PP 2 | D118.01 PP | Dow | 8.0 MFR | 0.900 |
| PP3 | INSPIRE 404 | Dow | 3.0 MFR | 0.900 |
| LLDPE | DOWLEX ™ 2247G | Dow | 2.3 MI | 0.917 |
| Plastomer | AFFINITY ™ PL 1880G | Dow | 1.0 MI | 0.902 |
| EVA 1 15% VA | ELVAX 3150 | DuPont | 2.5 MI | 0.940 |
| EVA 2 8.9% VA | ELVAX 3128 | DuPont | 2.0 MI | 0.930 |
| EVA-g-MAH 7% VA | BYNEL 30E783 | DuPont | 5.7 MI | 0.934 |
| Elastomer1 | ENGAGE 8402 | Dow | 30 MI | — |
| Elastomer2 | ENGAGE 8200 | Dow | 5 MI | — |
| LDPE 1 | LDPE 501i | Dow | 1.9 MI | 0.922 |
| LDPE 2 | LDPE 681i | Dow | 1.15 MI | 0.922 |

The crystalline block copolymer composites (CBC's) below are developmental materials prepared as described above and are summarized in Table 2. They have the following general characteristics:
i) an ethylene-based polymer (EP) that is crystalline (CEP);
ii) a propylene-based crystalline polymer (CPP) and
iii) a block copolymer comprising
  (a) an ethylene polymer block (EB) that is a crystalline ethylene block CEB) and
  (b) a crystalline propylene polymer block (CPPB).

As also shown in Table 2, the CBC samples are further characterized by the indicated:
  Wt % PP—Weight percentage propylene polymer in the CBC as measured by HTLC Separation as described above.
  Mw—the weight average molecular weight of the CBC in Kg/mol as determined by GPC as described above.
  Mw/Mn—the molecular weight distribution of the CBC as determined by GPC as described above.
  Wt % C2 in CBC—the weight percentage of ethylene in the CBC as determined by NMR, the balance being propylene.
  Tm (° C.) Peak 1 (Peak 2)—Peak melting temperature as determined by the second heating curve from DSC. Peak 1 refers to the melting of CPPB or CPP, whereas Peak 2 refers to the melting of CEB or CEP.
  Tc (° C.)—Peak crystallization temperature as determined by DSC cooling scan.
  Heat of Fusion (J/g)—the heat of fusion of the CBC measured as described above.
  Mol % C2 in CEB—the mole percentage of ethylene in the crystalline ethylene block component (iii)(a) (and also the crystalline ethylene polymer component (1) of the CBC), the balance of comonomer in both cases being propylene.
  Wt % CPPB in block copolymer—the weight percentage of crystalline propylene polymer in the block copolymer component (iii).
  CBCI—the crystalline block copolymer composite index which reflects the content of the block copolymer (iii) in the CBC composition.

TABLE 2

CBC and BC Resins Used in Experimental Film

| Resin | MFR | Density (g/cc) | Wt % PP | Mw Kg/mol | Mw/Mn | Wt % $C_2$ In CBC | Tm (° C.) Peak 1 (Peak 2) | Tc (° C.) | Heat of fusion (J/g) | Mol % $C_2$ in CEB | Wt % CPPB in (iii) | CBCI |
|---|---|---|---|---|---|---|---|---|---|---|---|---|
| CBC 1 | 3.6 | 0.9055 | 13.2 | 146 | 2.8 | 46.7 | 130 (114) | 97 | 126 | 93 | 50 | 0.729 |
| CBC 2 | 3.5 | 0.9007 | 34.0 | 209 | 3.3 | 28.9 | 136 (101) | 97 | 91 | 93 | 70 | 0.516 |
| CBC 3 | 1.4 | 0.9120 | 7.2 | 133 | 4.6 | 68.6 | 122 (114) | 99 | 123 | 93 | 30 | 0.702 |
| CBC 4 | 7.0 | 0.9052 | 14.2 | 128 | 4.0 | 46.9 | 132 (108) | 91 | 97 | 93 | 50 | 0.707 |

As also further indicated in the Tables below, other commercially available additives and stabilizers are employed in the formulation:

Antiblock: Ampacet 10799A masterbatches which consists of 50% talc in a 20 MI LLDPE carrier.

Slip Additive/Antiblock ("S/AB"): Supplied by Ampacet Corporation as Ampacet 102854 that contains 5% erucamide and 2.5% stearamide slip and 20% silicate anitblock in polyethylene carrier White Color 1: Supplied by Ampacet Corporation as Ampacet 110456 masterbatch which contains 50% $TiO_2$ in a 20 MI LLDPE carrier White Color 2: Supplied by Ampacet Corporation as Ampacet 110443 concentrate which contains 50% $TiO_2$ in a 8 MFR homopolymer polypropylene UV 1 & 2 (stabilizer) masterbatches: Produced by Dow Chemical according to Table 3.

Polymer Processing Additives ("PPA"): Supplied by Ampacet Corporation as Ampacet 102823 that contains a fluropolymer elastomer process aid in 2MI LLDPE carrier Vinyltrimethoxysilane ("VTMS"): Supplied by Dow Corning, Xiameter OFS-6300 Silane Peroxide: Supplied by Arkema, Luperox 101

TABLE 3

UV Stabilizer masterbatch formulations. All amounts are based on weight percent.

| Component | Type of additive | Supplier | UV 1 (wt %) | UV 2 (wt %) |
|---|---|---|---|---|
| LDPE2 | Resin | Dow Chemical | 89.5 | |
| PP2 | Resin | Dow Chemical | | 87.5 |
| Cyasorb UV1164 | UV stabilizers | Cytec Industries, Inc | 1.0 | |
| Cyasorb UV38535 | UV stabilizers | Cytec Industries, Inc | 4.0 | |
| Cyasorb UV3853PP5 | UV stabilizers | Cytec Industries, Inc | | 6.0 |
| Cyasorb UV3346 | UV stabilizers | Cytec Industries, Inc | 2.0 | |
| Cyasorb UV3529 | UV stabilizers | Cytec Industries, Inc | 2.0 | |
| Cyasorb THT7001 | UV stabilizers | Cytec Industries, Inc | | 3.0 |
| Uvinul 5050H | UV stabilizers | BASF Corporation | | 2.0 |
| Tinuvin 770 | UV stabilizers | BASF Corporation | | 1.0 |
| Irganox 1010 | Antioxidant | BASF Corporation | 0.75 | 0.25 |
| Irganox 168 | Antioxidant | BASF Corporation | 0.75 | |

The films are prepared using the indicated processing conditions in Table 4 on a pilot scale cast film line using a standard type of feedblock configuration to produce 3 layers and providing the PP side of the film against cast roll. The cast film components and structures are summarized in Table 5 below.

TABLE 4

Fabrication conditions for Experimental Cast Films 1-14

| | Condition 1 | | | Condition 2 | | |
|---|---|---|---|---|---|---|
| | Overall thickness, micron | | | | | |
| | 381 | | | 200 | | |
| | Layer | | | | | |
| | A | B | C | A | B | C |
| RPM | 41 | 25 | 99 | 40 | 20 | 100 |
| Feed zone, ° C. | 166 | 193 | 202 | 166 | 177 | 199 |
| Zone 2, ° C. | 182 | 204 | 210 | 177 | 191 | 204 |
| Zone 3, ° C. | 188 | 216 | 216 | 191 | 199 | 213 |
| Transfer line, screen, adapters, ° C. | 188 | 216 | 216 | 191 | 204 | 213 |
| Feedblock, ° C. | 216 | | | 210 | | |
| Die, ° C. | 216 | | | 210 | | |
| Cast roll, ° C. (nominal) | 50 | | | 85 | | |

TABLE 5

Summary of Experiment Cast Film Formulations 1 and 2.

| | Experiment No. | | | | | |
|---|---|---|---|---|---|---|
| | 1 | | | 2 | | |
| | Sample ID # | | | | | |
| | MC 2017-8 | | | MC 2017-9 | | |
| | Nominal Film Thickness | | | | | |
| | 200 | | | 200 | | |
| | Layer | | | | | |
| | A | B | C | A | B | C |
| Layer vol % | 25 | 12.5 | 62.5 | 25 | 12.5 | 62.5 |
| PP2 | | | 90 | | | 90 |
| Plastomer | | | 10 | | | 10 |
| EVA1 | | | | 21.0 | | |
| LDPE1 | 16.5 | | | | | |
| LLDPE | | | | 64.0 | | |
| EVA-g-MAH | 68.5 | | | | | |
| Antiblock | 15.0 | | | 15.0 | | |
| CBC1 | | 100 | | | 100 | |
| Conditions | 2 | | | 2 | | |

The films are tested for their sealing and interlayer strengths. The two A (top) layers are sealed together by heat sealing at 204° C. for 10 seconds at 30 psi (207 kPa, 2.07 bar) pressure. The films are thus sealed as CBA-ABC. The sealed films are then tested by a peel strength test according to ASTM F88/8F88-09 for 180° peel at 23° C. on an INSTRON® tester (model 5500R) at 50 mm gap at a rate of 50 mm/min. Peel strengths are recorded below. For films exhibiting a delamination failure, the location of the delamination is noted and the sample is tested in the INSTRON tester in a similar manner but by peeling the film layers that are then separating by delamination. This second peel test is the interlayer adhesion strength test done at 23° C. The layers that delaminate are recorded along with their interlayer adhesion strength values.

In some cases, the entire film thickness breaks, tears or greatly elongates as only failure and there is no delamination failure observable. In those cases, all the interlayer adhesion strength values are clearly excellent but there is no interlayer adhesion strength value measurable or recorded.

The experimental films are compared against a commercial backsheet film available from Madico and referred to as a TPE film. As indicated in the Madico technical datasheet, the TPE film thickness is 191 microns and has polyvinylfluoride (PVF) in the outside or bottom layer, PET in a core layer and EVA/LDPE blend in the top or seal layer. In the Table below, unless otherwise indicated, all amounts are based on weight percent.

TABLE 6

Peel test results comparing Madico film with Inventive Examples

| Experiment Number | Madico TPE | 1 | 2 |
|---|---|---|---|
| Seal-seal (A-A) peel strength | | | |
| Number of samples | 15 | 5 | 5 |
| Average seal strength, N/cm | 20.3 | 20.5 | 39.1 |
| Percent samples with no delamination | 60% | 100% | 100% |
| Number of samples with delamination | 6 | 0 | 0 |
| Location of interlayer delamination Interlayer peel | B-C | — | — |
| Avg interlayer strength of delaminating samples, N/cm | 2.2 | N/A | N/A |

As can be seen in Table 6 above, backsheet can be made using crystalline block composite that has better interlayer adhesion and no delamination within the backsheet structure as compared to commercial backsheet.

As shown below in Tables 7 and 8, Experimental Cast Films 3 through 8 having the noted formulations are similarly prepared according to the film process conditions and are similarly tested.

TABLE 7

Summary of Formulations and Structures of Experimental Cast Films 3 through 8

| Expt. No. | 3 | | | 4 | | | 5 | | | 6 | | | 7 | | | 8* | | |
|---|---|---|---|---|---|---|---|---|---|---|---|---|---|---|---|---|---|---|
| Sample ID # | MC 2034-13 | | | MC 2034-7 | | | MC 2034-8 | | | MC 2034-9 | | | MC 2034-10 | | | MC 2034-6 | | |
| Nominal Thickness (µ) | 381 | | | 381 | | | 381 | | | 381 | | | 381 | | | 381 | | |
| Layer | A | B | C | A | B | C | A | B | C | A | B | C | A | B | C | A | B | C |
| Approx Layer Vol % | 25 | 15 | 60 | 25 | 15 | 60 | 25 | 15 | 60 | 25 | 15 | 60 | 25 | 15 | 60 | 25 | 15 | 60 |
| PP1 | | 0 | | 82 | | | 82 | | | 82 | | | 82 | | | 82 | | |
| PP2 | | 82 | | | | | | | | | | | | | | | | |
| LLDPE | 30 | | | 30 | | | 30 | | | 30 | | | 30 | | | 30 | | |
| Plastomer | | | | | | | | | | | | | | | | 80 | | |
| CBC 1 | | | | | | | | 80 | | | | | | | | | | |
| CBC2 | | | | | | | | | | | 80 | | | | | | | |
| CBC3 | | | | | | | | | | | | | | 80 | | | | |
| CBC4 | | 80 | | | 80 | | | | | | | | | | | | | |
| EVA2 | 60 | | | 60 | | | 60 | | | 60 | | | 60 | | | 60 | | |
| UV1 | 10 | | | 10 | | | 10 | | | 10 | | | 10 | | | 10 | | |
| UV2 | | 10 | | | 10 | | | 10 | | | 10 | | | 10 | | | 10 | |
| Color1 | | 20 | | | 20 | | | 20 | | | 20 | | | 20 | | | 20 | |
| Color 2 | | | 8 | | | 8 | | | 8 | | | 8 | | | 8 | | | 8 |
| Fab Condition | | | 1 | | | 1 | | | 1 | | | 1 | | | 1 | | | 1 |

*Comparative Experiment - not an example of the present invention.

TABLE 8

Peel Test Results for Experimental Cast Films 3 through 8

| | Experiment Number | | | | | |
|---|---|---|---|---|---|---|
| | 3 | 4 | 5 | 6 | 7 | 8* |
| | Number of samples tested | | | | | |
| | 6 | 3 | 7 | 2 | 3 | 3 |
| Seal-seal (A-A) peel | | | | | | |
| Average seal strength, N/cm | 67.1 | 63.0 | 49.8 | 9.7 | 49.2 | 20.8 |
| % Samples without delamination | 83% | 100% | 86% | 0% | 0% | 0% |
| Interlayer peel | | | | | | |
| Location of interlayer delamination | B-C | N/A | B-C | B-A | B-C | B-C |
| Avg interlayer strength of delaminating samples, N/cm | 15.8 | N/A | 15.3 | 10.7 | 18.7 | 6.5 |

*Comparative Experiment - not an example of the present invention.

The film examples prepared according to the present invention all exhibit good to excellent interlayer strength. In comparative Experimental Film 8, instead of a tie layer Layer B comprising CBC according to the present invention, the tie layer for the polypropylene film layer C is a plastomer that is commonly sold and used for this purpose and is considered suitable in many applications. It is noteworthy, therefore, that all the films according to the present invention have higher interlayer strength than comparative Experimental Film 8.

As summarized below in Tables 9 and 10, further Experimental Films 9 through 12 are prepared on a mini-scale blown film line and evaluated for their sealing and interlayer strengths. Table 9 summarizes the process conditions. Experimental films 9-12 show, among other things, that films which have more CBC in the tie layer Layer B results in less delamination.

TABLE 9

Process Conditions for Experimental Blown Films 9 to Ex. 12

| Process Conditions | Fabrication Condition 3 | | |
|---|---|---|---|
| Mini-Blown Co-extrusion Line, Larkin 200 Midland MI | | | |
| RPM | 55 | 41 | 100 |
| Feed zone 1, ° C. | 166 | 182 | 202 |
| Zone 2, ° C. | 177 | 188 | 207 |
| Zone 3, ° C. | 182 | 193 | 210 |
| Transfer line, screen, adapters, ° C. | 193 | 193 | 210 |
| Feedblock, ° C. | 193 | | |
| Die, ° C. | 193 | | |
| Air ring speed, % | 60 | | |
| Nominal Nip speed (mm/minute) | 914 | | |
| Nominal Layflat (mm) | 152 | | |

TABLE 10

Summary of Formulations, Structures and Test Results for Expt. Blown Films 9-12

| | Expt. Film No. | | | | | | | | | | |
|---|---|---|---|---|---|---|---|---|---|---|---|
| | 9 | | | 10 | | | 11 | | | 12 | |
| | Sample | | | | | | | | | | |
| | MB 2045-2 | | | MB 2045-3 | | | MB 2045-4 | | | MB 2045-5 | |
| | Nominal thickness, mil (μm) | | | | | | | | | | |
| | 8 (200) | | | 8 (200) | | | 8 (200) | | | 8 (200) | |
| | Layer | | | | | | | | | | |
| | A | B | C | A | B | C | A | B | C | A | B | C |
| Approximate Layer vol % | 25 | 25 | 50.0 | 25 | 25 | 50.0 | 25 | 25 | 50.0 | 25 | 25 | 50.0 |
| PP1 | | 30 | 100 | | 20 | 100 | | 10 | 100 | | | 100 |
| LLDPE | 40 | 30 | | 40 | 20 | | 40 | 10 | | 40 | | |
| CBC4 | | 40 | | | 60 | | | 80 | | | 100 | |
| EVA2 | 60 | | | 60 | | | 60 | | | 60 | | |
| Conditions | | 3 | | | 3 | | | 3 | | | 3 | |
| Seal-seal (A-A) | | | | | | | | | | | | |
| No. Samples Interlayer Testing | | 10 | | | 10 | | | 10 | | | 10 | |
| Avg seal strength, N/cm | | 14.1 | | | 16.4 | | | 19.2 | | | 40.1 | |
| % Samples w/o delamination | | 10% | | | 40% | | | 70% | | | 100% | |
| Location of delamination | | B-C | | | B-C | | | B-C | | | N/A | |

As shown in Table 11 below, further evaluations of Experimental Films are performed under conditions reflecting lamination and high temperature use of the film structures. For testing at 85° C. the same procedures of sample preparation and testing are followed as above but the test is conducted at 85 C rather than at 23° C. To achieve this condition a hot-cold chamber from INSTRON (model 3119-005) is heated to 85° C., samples are loaded into the jaw grips and the door closed. When chamber returns to 85° C., the samples are heat soaked for 2 minutes and the peel test is then started.

Demonstrating performance under higher, annealing temperature conditions employed in assembling backsheet films into electronic devices such as photovoltaic modules, annealed samples are prepared by heat sealing samples in the same manner as described above, separating the unsealed tabs with Teflon film to prevent sticking of tabs and heating the samples for 15 minutes in an air oven operating at 150° C., removing the samples and then testing peel strengths as described above at 23° C.

TABLE 11

Higher Temperature Peel Test Results

| Experiment Number | Madico TPE | 2 | 5 | 8* |
|---|---|---|---|---|
| Seal-seal (A-A) peel @23° C. | | | | |
| Average seal strength, N/cm | 20.3 | 20.7 | 49.8 | 20.8 |
| % Samples without delamination | 60% | 100% | 86% | 0% |
| Interlayer peel @23° C. | | | | |
| Location of interlayer delamination | B-C | — | B-C | B-C |
| Avg interlayer strength of delaminating samples, N/cm | 6.6 | No delam | 15.3 | 6.6 |
| Seal-seal (A-A) peel @85° C. | | | | |
| Average seal strength, N/cm | 14.6 | 11.6 | 14.7 | 9.7 |
| % Samples without delamination | 60% | 100% | 100% | 0% |
| Interlayer peel @85° C. | | | | |
| Location of interlayer delamination | B-C | — | — | B-C |
| Avg interlayer strength of delaminating samples, N/cm | 11.3 | No delam | No delam | 6.7 |
| Seal-seal (A-A) peel @23° C. after annealing at 150° C. for 15 minutes | | | | |
| Average seal strength, N/cm | 78.3 | 34.8 | 60.2 | 15.6 |
| % Samples without delamination | 60% | 100% | 100% | 0% |
| Interlayer peel @23° C. after annealing | | | | |
| Location of interlayer delamination | — | — | — | B-C |
| Avg interlayer strength of delaminating samples, N/cm | — | No delam | No delam | 1.4 |

The results given in Table 11 show that films made using B layer comprising CBC shows no delamination at 85° C. reflecting PV module use temperatures. Similarly, films made using B layer comprising CBC shows no delamination after annealing at 150° C. for 15 minutes reflecting lamination conditions commonly used for construction of PV modules. For these tests TPE shows no improvement in resistance to delamination. Conversely, in comparative Experimental Film 8, where the B layer comprises plastomer, the interlayer adhesion decreases after annealing at 150° C. for 15 minutes.

Unless stated to the contrary, implicit from the context, or customary in the art, all parts and percents are based on weight and all test methods are current as of the filing date of this disclosure. For purposes of United States patent practice, the contents of any referenced patent, patent application or publication are incorporated by reference in their entirety (or its equivalent US version is so incorporated by reference) especially with respect to the disclosure of synthetic techniques, definitions (to the extent not inconsistent with any definitions specifically provided in this disclosure), and general knowledge in the art.

The numerical ranges in this disclosure are approximate, and thus may include values outside of the range unless otherwise indicated. Numerical ranges include all values from and including the lower and the upper values, in increments of one unit, provided that there is a separation of at least two units between any lower value and any higher value. As an example, if a compositional, physical or other property or process parameter, such as, for example, molecular weight, viscosity, melt index, temperature, etc., is from 100 to 1,000, it is intended that all individual values, such as 100, 101, 102, etc., and sub ranges, such as 100 to 144, 155 to 170, 197 to 200, etc., are expressly enumerated. For ranges containing values which are less than one or containing fractional numbers greater than one (e.g., 1.1, 1.5, etc.), one unit is considered to be 0.0001, 0.001, 0.01 or 0.1, as appropriate. For ranges containing single digit numbers less than ten (e.g., 1 to 5), one unit is typically considered to be 0.1. These are only examples of what is specifically intended, and all possible combinations of numerical values between the lowest value and the highest value enumerated, are to be considered to be expressly stated in this disclosure. Numerical ranges are provided within this disclosure for, among other things, density, melt index and relative amounts of components in various compositions and blends.

The term "comprising" and its derivatives are not intended to exclude the presence of any additional component, step or procedure, whether or not the same is specifically disclosed. In order to avoid any doubt, any process or composition claimed through use of the term "comprising" may include any additional steps, equipment, additive, adjuvant, or compound whether polymeric or otherwise, unless stated to the contrary. In contrast, the term, "consisting essentially of" excludes from the scope of any succeeding recitation any other component, step or procedure, excepting those that are not essential to operability. The term "consisting of" excludes any component, step or procedure not specifically delineated or listed. The term "or", unless stated otherwise, refers to the listed members individually as well as in any combination.

Although the invention has been described in considerable detail through the preceding description and examples, this detail is for the purpose of illustration and is not to be construed as a limitation on the scope of the invention.

What is claimed is:

1. A multilayer film structure comprising: a tie Layer B and a bottom Layer C;
    B. the tie layer B has a top facial surface and a bottom facial surface;
    C. the bottom layer C comprises a propylene-based polymer having at least one melting peak greater than 125 C and has a top facial surface and a bottom facial surface, and the top facial surface of Layer C is in adhering contact with the bottom facial surface of Layer B;
    wherein the Layer B consists of (1) a block composite resin (BC), (2) an optional colorant, (3) an optional stabilizer, and (4) an optional antioxidant, the BC made from monomers consisting of propylene and ethylene, and the BC has
    i) an ethylene-propylene copolymer (EP) comprising at least 80 mol % polymerized ethylene;
    ii) a crystalline propylene-based polymer (CPP); and
    iii) a diblock copolymer comprising (a) an ethylene-propylene block comprising at least 80 mol % polymerized ethylene and (b) a crystalline propylene block.

2. The multilayer film structure of claim 1 wherein the CPP comprises greater than 90 mol % polymerized propylene.

3. The multilayer film structure of claim 2 wherein the block composite resin in Layer B has two peak melting temperatures and a first peak melting temperature greater than 120° C.

4. The multilayer film structure of claim 1 wherein the crystalline propylene block (iii)(b) of the diblock copolymer is the same composition as the crystalline propylene-based polymer (CPP) of the block composite resin.

5. The multilayer film structure of claim 4 wherein the ethylene-propylene block (iii)(a) of the diblock copolymer is the same composition as the EP copolymer of the block composite resin.

6. The multilayer film structure of claim 1 wherein the Layer B block composite resin has an ethylene-propylene block amount in the range of from 30 to 70 weight % based on total weight of the diblock copolymer (iii).

7. The multilayer film structure of claim 1 wherein the block composite resin has a crystalline block composite index (CBCI) from 0.3 to 0.8.

8. The multilayer film structure of claim 1 wherein the tie Layer B is a blend with greater than 40 weight percent of the block composite resin.

9. The multilayer film structure of claim 1 comprising:
(A) a seal layer A having a top facial surface and a bottom facial surface, the bottom facial surface of layer a in adhering contact with the top facial surface of layer B.

10. The multilayer film structure of claim 9 wherein the layer A comprises a linear low density polyethylene (LLDPE).

11. The multilayer film structure of claim 10 wherein the layer A comprises a blend formulation of a linear low density polyethylene (LLDPE) comprising a polar ethylene copolymer in an amount from 10 weight % to 45 weight %.

12. The multilayer film structure of claim 9 wherein the layer A comprises a block composite resin and the layer A composition is different from the layer B composition.

13. The multilayer film structure of claim 9 wherein Layer A is from greater than 0 to 200 micrometer (µm) in thickness; Layer B is from 25 to 100 µm in thickness; and Layer C is from 150 to 350 µm in thickness.

14. The multilayer film structure of claim 1 wherein the block composite resin has a density from 0.905 g/cc to 0.912 g/cc.

15. The multilayer film structure of claim 1 comprising
a top seal Layer A comprising a blend formulation of a linear low density polyethylene (LLDPE) comprising a polar ethylene copolymer in an amount from 10 weight % to 45 weight %;
the bottom Layer C comprising the propylene-based polymer; and
the Layer B between Layer A and Layer C, the block composite resin with
i) an ethylene-propylene copolymer (EP) comprising at least 93 mol % polymerized ethylene;
ii) the crystalline propylene-based polymer; and
iii) a diblock copolymer comprising (a) an ethylene-propylene block comprising at least 93 mol % polymerized ethylene and (b) a crystalline propylene block.

16. An electronic device (ED) module comprising an electronic device and a multilayer film structure according to claim 1.

17. The multilayer film structure of claim 1 wherein the Layer (B) consists of (1) the BC, (2) the colorant, (3) the stabilizer that is a UV stabilizer, and (4) the antioxidant.

18. The multilayer film structure of claim 1 wherein the Layer (B) consists of (1) the BC, (2) the colorant, and (3) the stabilizer that is a UV stabilizer.

19. The multilayer film structure of claim 1 wherein the Layer (B) consists of (1) the BC, and (2) the colorant.

* * * * *